(12) United States Patent
Kim et al.

(10) Patent No.: US 11,996,457 B2
(45) Date of Patent: May 28, 2024

(54) SEMICONDUCTOR DEVICES

(71) Applicant: SAMSUNG ELECTRONICS CO., LTD., Suwon-si (KR)

(72) Inventors: Hyuncheol Kim, Seoul (KR); Yongseok Kim, Suwon-si (KR); Ilgweon Kim, Hwaseong-si (KR); Seokhan Park, Seongnam-si (KR); Kyunghwan Lee, Seoul (KR); Jaeho Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 205 days.

(21) Appl. No.: 17/443,553

(22) Filed: Jul. 27, 2021

(65) Prior Publication Data

US 2022/0199793 A1 Jun. 23, 2022

(30) Foreign Application Priority Data

Dec. 18, 2020 (KR) .................. 10-2020-0178360

(51) Int. Cl.
*H01L 29/423* (2006.01)
*H01L 23/482* (2006.01)
(Continued)

(52) U.S. Cl.
CPC ...... *H01L 29/4236* (2013.01); *H01L 23/4828* (2013.01); *H01L 29/66734* (2013.01); *H01L 29/7813* (2013.01)

(58) Field of Classification Search
CPC .......... H01L 29/4236; H01L 29/66734; H01L 29/7813; H01L 23/4828
(Continued)

(56) References Cited

U.S. PATENT DOCUMENTS 8,124,479 B2   2/2012   Jang
8,507,374 B2   8/2013   Kim
(Continued)

FOREIGN PATENT DOCUMENTS

KR   10-0891621   3/2009
KR   10-1335714   11/2013
TW   201234494   8/2012

OTHER PUBLICATIONS

Taiwanese Office Action dated Mar. 3, 2022 For Taiwanese Application Serial No. 110128122.

*Primary Examiner* — Igwe U Anya
(74) *Attorney, Agent, or Firm* — F. CHAU & ASSOCIATES, LLC

(57) ABSTRACT

A semiconductor device includes a plurality of semiconductor structures disposed on a substrate, a first conductive pattern, a first conductive pattern, a gate insulation pattern, a second conductive pattern and a second impurity region. Each of the semiconductor structures includes a first semiconductor pattern that has a linear shape that extends in a first direction and second semiconductor patterns that protrude from an upper surface of the first semiconductor pattern in a vertical direction. The semiconductor structures are spaced apart from each other in a second direction perpendicular to the first direction. The first conductive pattern is formed between the first semiconductor patterns. The first impurity region is formed in an opening in the first semiconductor pattern adjacent to a first sidewall of the second semiconductor pattern. The first impurity region includes an impurity diffusion barrier pattern and a polysilicon pattern doped with impurities.

18 Claims, 22 Drawing Sheets

(51) Int. Cl.
*H01L 29/66* (2006.01)
*H01L 29/78* (2006.01)

(58) Field of Classification Search
USPC .......................................................... 257/330
See application file for complete search history.

(56) References Cited

U.S. PATENT DOCUMENTS

| | | |
|---|---|---|
| 8,513,103 B2 | 8/2013 | Park et al. |
| 8,759,890 B2 | 6/2014 | Hong |
| 8,912,530 B2 | 12/2014 | Yang et al. |
| 9,287,169 B2 | 3/2016 | Myung et al. |
| 10,398,170 B2 | 8/2019 | Schulze et al. |
| 2011/0298046 A1* | 12/2011 | Hong .................. H10B 12/482 |
| | | 438/270 |
| 2012/0112270 A1* | 5/2012 | Park .................. H01L 21/32134 |
| | | 257/E21.345 |
| 2012/0146136 A1 | 6/2012 | Park |
| 2012/0146221 A1* | 6/2012 | Shim .................. H10B 12/485 |
| | | 438/653 |
| 2013/0292792 A1* | 11/2013 | Hong .................. H01L 29/7827 |
| | | 257/506 |

* cited by examiner

SEMICONDUCTOR DEVICES

CROSS-REFERENCE TO RELATED APPLICATION

This application claims priority under 35 USC § 119 from Korean Patent Application No. 10-2020-0178360, filed on Dec. 18, 2020 in the Korean Intellectual Property Office (KIPO), the contents of which are herein incorporated by reference in their entirety.

BACKGROUND

1. Technical Field

Embodiments are directed to a semiconductor device. More particularly, embodiments are directed to a semiconductor device that includes vertical channel transistors.

2. Description of the Related Art

To manufacture a semiconductor device having high integration, the semiconductor device is provided with a vertical channel transistor that has a vertical channel that extends in a direction perpendicular to a surface of a substrate. A vertical channel transistor can be used as a selection transistor in a memory cell, so that a memory device can be highly integrated.

SUMMARY

Embodiments provide a semiconductor device that includes vertical channel transistors.

According to some embodiments, there is provided a semiconductor device that includes a plurality of semiconductor structures on a substrate, a first conductive pattern, a first impurity region, a gate insulation pattern, a second conductive pattern and a second impurity region. Each of the semiconductor structures includes a first semiconductor pattern that has a linear shape that extends in a first direction and second semiconductor patterns that protrude in a vertical direction from an upper surface of the first semiconductor pattern. The semiconductor structures are spaced apart from each other in a second direction perpendicular to the first direction. The first conductive pattern is formed in a first trench between the first semiconductor patterns. The first conductive pattern extends in the first direction. The first impurity region is formed in an opening in the first semiconductor pattern adjacent to a first sidewall of the second semiconductor pattern. The first impurity region includes an impurity diffusion barrier pattern and a polysilicon pattern doped with impurities. The gate insulation pattern is formed on the first sidewall of each of the second semiconductor pattern. The second conductive pattern is formed on the gate insulation pattern, and extends in the second direction. The second impurity region is formed on each of the second semiconductor patterns.

According to some embodiments, there is provided a semiconductor device that includes a plurality of semiconductor structures disposed on a substrate, a first conductive pattern, a first insulation pattern, a first impurity region, a gate insulation pattern, a second conductive pattern and a second impurity region. Each of the semiconductor structures includes a first semiconductor pattern that has a line shape that extends in a first direction and second semiconductor patterns that protrude in a vertical direction from an upper surface of the first semiconductor pattern. The semiconductor structures are spaced apart from each other in a second direction perpendicular to the first direction. The first conductive pattern is formed in a first trench between the first semiconductor patterns. The first conductive pattern extends in the first direction. The first insulation pattern is formed in the first trench between the first semiconductor patterns. The first insulation pattern contacts a sidewall of the first conductive pattern. The first insulation pattern extends in the first direction. The first impurity region extends from a position spaced apart from a lower portion of a first sidewall of the second semiconductor pattern to a position that overlaps a partial lower surface of the second semiconductor pattern. The first impurity region includes an impurity diffusion barrier pattern and a polysilicon pattern doped with impurities. The gate insulation pattern is formed on the first sidewall of each of the second semiconductor patterns. The second conductive pattern extends in the second direction on the gate insulation pattern. The second impurity region is formed on each of the second semiconductor patterns. A sidewall of the first impurity region and a sidewall of the first conductive pattern contact each other.

According to some embodiments, there is provided a semiconductor device that includes a semiconductor structure disposed on a substrate, a first impurity region, a gate insulation pattern, a second conductive pattern and a second impurity region. The semiconductor structure includes a first semiconductor pattern that has a linear shape that extends in a first direction and second semiconductor patterns that protrude in a vertical direction from an upper surface of the first semiconductor pattern. The first impurity region extends from a position spaced apart from a lower portion of a first sidewall of the second semiconductor pattern to a position that overlaps a partial lower surface of the second semiconductor pattern. The first impurity region includes an impurity diffusion barrier pattern and a polysilicon pattern doped with impurities. The gate insulation pattern is formed on the first sidewall of the second semiconductor pattern. The second conductive pattern is formed on the gate insulation pattern. The second impurity region is formed on the second semiconductor patterns. The impurity diffusion barrier-pattern surrounds sidewalls and a bottom of the polysilicon pattern.

In semiconductor devices according to some embodiments, the first impurity region positioned under the second semiconductor pattern includes the impurity diffusion barrier pattern and the polysilicon pattern doped with impurities. The impurity diffusion barrier pattern prevents diffusion of impurities doped in the polysilicon pattern. Therefore, a floating body effect in the vertical transistor is reduced, and the semiconductor device has excellent operating characteristics.

DETAILED DESCRIPTION

Figure 1:
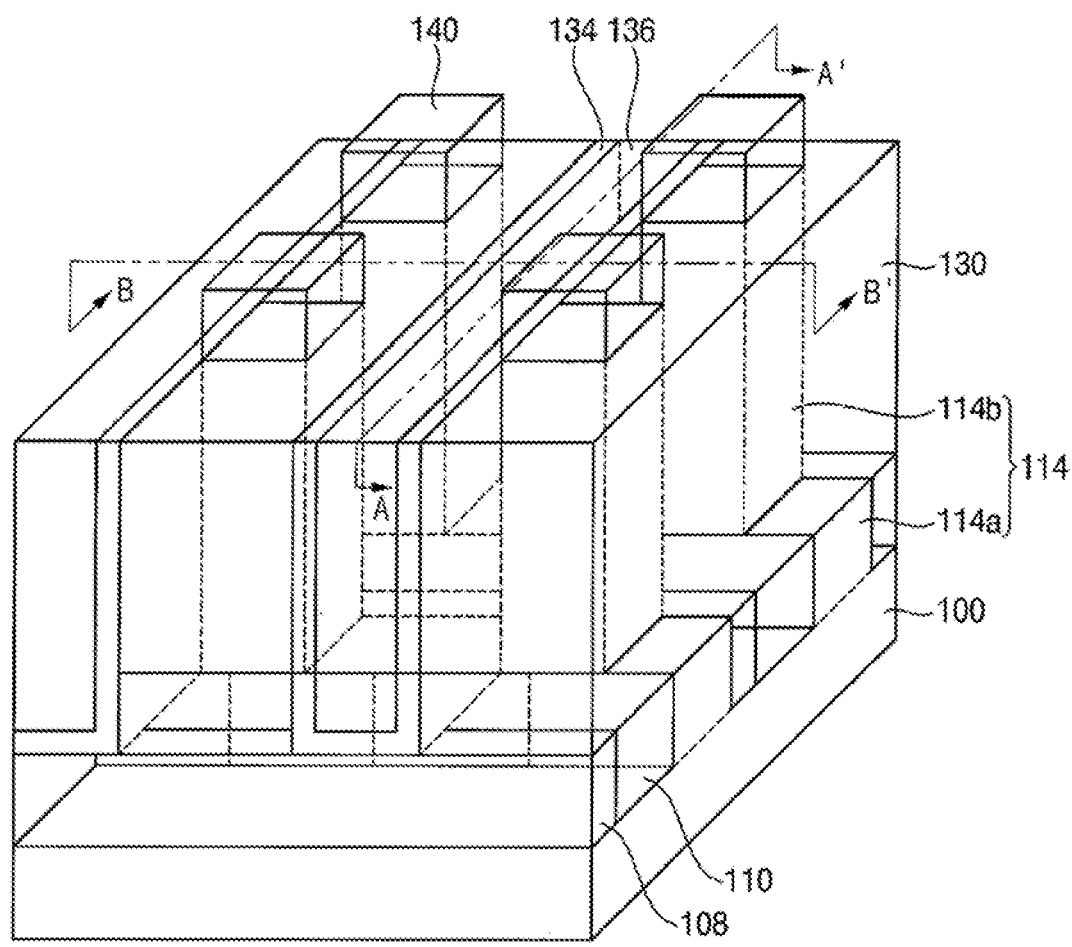
FIG. 1 is a perspective view of a semiconductor device in accordance with some embodiments.
Figure 2:
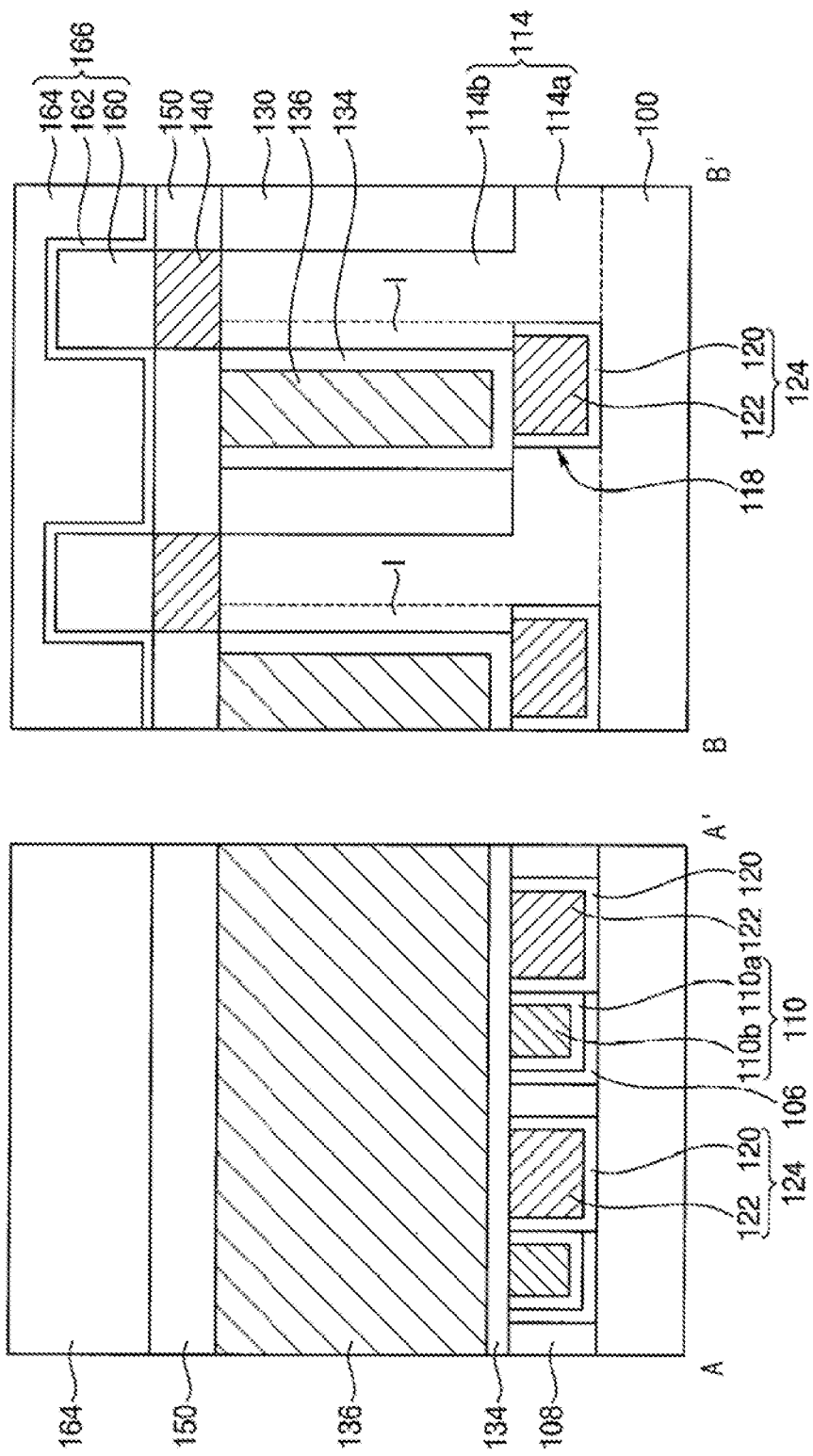
FIG. 2 is cross-sectional views of a semiconductor device in accordance with some embodiments.

FIG. 1 is a perspective view of a semiconductor device in accordance with some embodiments. FIG. 2 is cross-sectional views of a semiconductor device in accordance with some embodiments.

In some embodiments, a semiconductor device is a DRAM device. In FIG. 1, a capacitor is omitted to reduce the complexity of the drawing. FIG. 2 shows cross-sectional views cut along lines A-A' and B-B' of FIG 1.

Referring to FIGS. 1 and 2, in some embodiments, a semiconductor structure 114 is formed on a semiconductor substrate 100.

In some embodiments, the semiconductor structure 114 is formed by etching a portion of a bare semiconductor substrate. Thus, the semiconductor substrate 100 and the semiconductor structure 114 include substantially the same semiconductor material, and include, e.g., single crystal silicon. In some embodiments, at least a portion of the semiconductor structure 114 is formed by an epitaxial growth process.

In some embodiments, the semiconductor structure, 114 includes a first semiconductor pattern 114a and second semiconductor patterns 114b. The first semiconductor pattern 114a has a linear shape that extends in a first direction. The second semiconductor patterns 114b is formed on the first semiconductor pattern 114a. Each of the second semiconductor patterns 114b has a pillar shape that protrudes from an upper surface of the first semiconductor pattern 114a in a third direction perpendicular to the upper surface of the first semiconductor pattern 114a.

In some embodiments, a plurality of first semiconductor patterns 114a are spaced apart from each other in a second direction perpendicular to the first direction. Thus, a first trench is formed between the first semiconductor patterns 114a, and the first trench extends in the first direction.

In some embodiments, the second semiconductor patterns 114b are disposed on each of the first semiconductor patterns 114a and are uniformly spaced-apart from each other. The second semiconductor patterns 114b are arranged in each of the first and second directions. Therefore, the second semiconductor patterns 114b are arranged in a lattice shape. In some embodiments, the semiconductor structure 114 is doped with p-type impurities.

In some embodiments, each second semiconductor pattern 114b is a channel region of a vertical channel transistor. One vertical channel transistor is formed on each of the second semiconductor patterns 114b.

In some embodiments, a first conductive pattern 110 and a first insulation pattern 108 are formed in the first trench. The first conductive pattern 110 and the first insulation pattern 108 extend in the first direction. The first conductive pattern 110 and the first insulation pattern 108 are adjacent to each other in the second direction. A second insulation pattern 106 is further formed that covers a portion of a sidewall and bottom of the first conductive pattern 110.

In some embodiments, the second insulation pattern 106 and the first conductive pattern 110 are formed on a first sidewall of the first trench. The first insulation pattern 108 is formed on a second sidewall that faces the first sidewall of the first trench. The first conductive pattern 110 is a buried bit line.

In some embodiments, the first conductive pattern 110 includes, e.g., a barrier metal pattern 110a and a metal pattern 110b. In each of the perspective views, the second insulation pattern, the barrier metal pattern, and the metal pattern are omitted to reduce the complexity of the drawing.

In some embodiments, the barrier metal pattern 110a includes, e.g., one or more of Ti, Ta, TiN, TaN, or WN, etc. The metal pattern 110b includes, e.g., one or more of W, Al, Cu, Ru, Mo, Pt, Ni, Co, TiAl, TiSi, TiSiN, TaSi, TaSi, TaSiN, RuTiN, NiSi, or CoSi, etc.

In some embodiments, upper surfaces of the first, conductive pattern 110 and the first insulation pattern 108 are coplanar with an upper surface of the first semiconductor pattern 114a. Alternatively, the upper surfaces of the first conductive pattern 110 and the first insulation pattern 108 are lower than the upper surface of the first semiconductor pattern 114a.

In some embodiments, a first opening 118 (see FIG. 9) is formed at a portion of the first semiconductor pattern 114a adjacent in the first direction to the first sidewall of the second semiconductor pattern 114b. The first opening 118 is positioned at a portion that corresponds to a first impurity region of the vertical channel transistor.

In some embodiments, the first opening 118 has an isolated shape. The first conductive pattern 110 is exposed in the second direction by a Inst sidewall of the first opening 118. The first insulation pattern 108 is exposed by a second sidewall that faces the first sidewall of the first opening 118. That is, the second insulation pattern 106 on one sidewall of the first conductive pattern 110 is selectively removed to expose the barrier metal pattern 110a in the first conductive pattern 110 on the first sidewall of the first opening 118. The first opening 118 extends from a portion of the first semiconductor pattern 114a adjacent to the first sidewall of the second semiconductor pattern 114b to a portion of the first semiconductor pattern 114a under the second semiconductor pattern 114b, and thus the first opening 118 has an undercut shape.

In some embodiments, an impurity diffusion barrier pattern 120 is conformally formed on sidewalls and bottom of the first opening 118.

In some embodiments, a first polysilicon pattern 122 that fills the first opening 118 is formed on the impurity diffusion barrier pattern 120. The first polysilicon pattern 122 is doped with impurities. For example, the first polysilicon pattern 122 is doped with n-type impurities. The impurity diffusion barrier pattern 120 and the first polysilicon pattern 122 serve as a first impurity region 124 that is a source/drain region of the vertical channel transistor. The first impurity region 124 extends from a position spaced apart from a lower portion of the first sidewall of the second semiconductor pattern 114b, which is a channel region of the vertical channel transistor, to a position that overlaps a partial lower surface of the second semiconductor pattern 114b.

In some embodiments, the impurity diffusion barrier pattern 120 surrounds sidewalls and a bottom of the first polysilicon pattern 122. The impurity diffusion barrier pattern 120 includes a material that prevents diffusion of impurities. The impurity diffusion barrier pattern 120 prevents impurities doped in the first polysilicon pattern 122 from diffusing into the first and second semiconductor patterns 114a and 114b adjacent to the first polysilicon pattern 122.

In some embodiments, the first impurity region 124 and the first conductive pattern 110 are adjacent to each other in the second direction. A sidewall of the first impurity region 124 contacts a sidewall the first conductive pattern 110.

In particular, in some embodiments, the impurity diffusion barrier pattern 120 of the first impurity region 124 contacts the barrier metal pattern 110a of the first conductive pattern 110 in the second direction. The first polysilicon pattern 122 is electrically connected to the first conductive pattern 110 via the impurity diffusion barrier pattern 120. Therefore, the impurity diffusion barrier pattern 120 includes a low resistance conductive material. The impurity diffusion barrier pattern 120 may include a material having low contact resistance with the first conductive pattern 110.

In some embodiments, the impurity diffusion barrier pattern 120 includes graphene. When the impurity diffusion barrier pattern 120 includes graphene, the impurity diffusion barrier pattern 120 can prevent the diffusion of impurities from the first polysilicon pattern 122, and the impurity diffusion barrier pattern 120 that includes graphene has a low resistance.

In some embodiments, to prevent diffusion of the impurities and reduce contact resistance with the first conductive pattern, the graphene of the impurity diffusion barrier pattern 120 has a thickness of about 0.1 nm to about 0.5 nm. In some embodiments, the graphene has a thickness of about 0.2 nm to about 0.4 nm. However, embodiments are not limited thereto, and the thickness of the graphene can vary in other embodiments.

In some embodiments, the first impurity region 124 is formed in the first opening 118, and the first impurity region 124 does not extend to the first semiconductor pattern 114a adjacent to the first opening 118. Therefore, the first impurity region 124 is defined by the first opening 118.

In some embodiments, the first opening 118 overlaps only a portion of the partial lower surface of the second semiconductor pattern 114b, and does not overlap an entire lower surface of the second semiconductor pattern 114b.

In some embodiments, a first insulating interlayer 130 is formed that covers the first conductive pattern 110, the semiconductor structure 108, the first insulation pattern 108 and the first impurity region 124. The first insulating interlayer 130 includes, e.g., silicon oxide.

In some embodiments, a second trench 132 (see FIG. 15) is formed in the first insulating interlayer 130, and the second trench 132 extends in the second direction.

In some embodiments, the first sidewall of the second semiconductor pattern 114b is exposed by a first sidewall of the second trench 132. The second semiconductor pattern 114b is not exposed by a second sidewall that faces the first sidewall of the second trench 132, and the first insulating interlayer 130 is exposed by the second sidewall of the second trench 132. An upper portion of the first impurity region 124 is exposed by a bottom of the second trench 132.

In some embodiments, a gate insulation pattern 134 is conformally formed on sidewalls and a bottom of the second trench 132. The gate insulation pattern 134 contacts the first sidewall of the second semiconductor pattern 114b, and the gate insulation pattern 134 covers the upper portion of the first impurity region 124.

In some embodiments, the gate insulation pattern 134 includes silicon oxide. In some embodiments, the gate insulation pattern 134 includes a metal oxide that has a high dielectric constant. The metal oxide may be one of, e.g., $HfO_2$, $HfSiO$, $HfSiON$, $HfTaO$, $HfTiO$, $HfZrO$, $ZrO_2$, $Al_2O_3$, titanium oxide, or tantalum oxide, etc.

In some embodiments, a second conductive pattern 136 that fills the second trench 132 is formed on the gate insulation pattern 134 and between portions of the gate insulation pattern 134 that cover sidewalls of the second trench 132. The second conductive pattern 136 serves as a gate electrode of the vertical channel transistor. The second conductive pattern 136 extends in the second direction, and the second conductive pattern 136 serves as a word line.

In embodiments, the second conductive pattern 136 includes at least one of a metal, a conductive metal nitride, a conductive metal silicide, or a conductive metal oxide. For example, the second conductive pattern 136 includes at least one of, e.g., W, Ti, Ta, TiN, TaN, WN, Al, Cu, Ru, Mo, Pt, Ni, Co, NbN, TiAl, TiAlN, TiSi, TiSiN, TaSi, TaSiN, RuTiN, NiSi, CoSi, IrOx, or RuO, etc. In some embodiments, the second conductive patter 136 includes polysilicon doped with impurities.

In some embodiments, uppermost surfaces of the gate insulation pattern 134 and the second conductive pattern 136 are coplanar with an uppermost surface of the second semiconductor pattern 114b.

In some embodiments, a second polysilicon pattern 140 is formed on the uppermost surface of the second semiconductor pattern 114b. The second polysilicon pattern 140 is doped with impurities of a same conductivity type as that of the first polysilicon pattern 122. For example, the second polysilicon pattern 140 is doped with n-type impurities. The second polysilicon pattern 140 is a second impurity region that serves as a source/drain region of the vertical channel transistor, and thus second polysilicon pattern 140 and the second impurity region are denoted by the same reference numeral.

In some embodiments, a second insulating interlayer 150 is formed on both sides of the second polysilicon pattern 140. The second insulating interlayer 150 is formed on the first insulating interlayer 130, the gate insulation pattern 134 and the second conductive pattern 136.

In some embodiments, a capacitor 166 is formed on the second polysilicon pattern 140.

In some embodiments, the capacitor 166 includes a lower electrode 160, a dielectric layer 162 and an upper electrode 154. The lower electrode 160 may have a pillar shape or a hollow cylindrical shape.

As described above, a vertical channel transistor according to some embodiments is formed on the semiconductor structure 114. The vertical channel transistor includes the first impurity region 124, the second impurity region 140, the gate insulation pattern 134 and the second conductive pattern 136.

Figure 3:
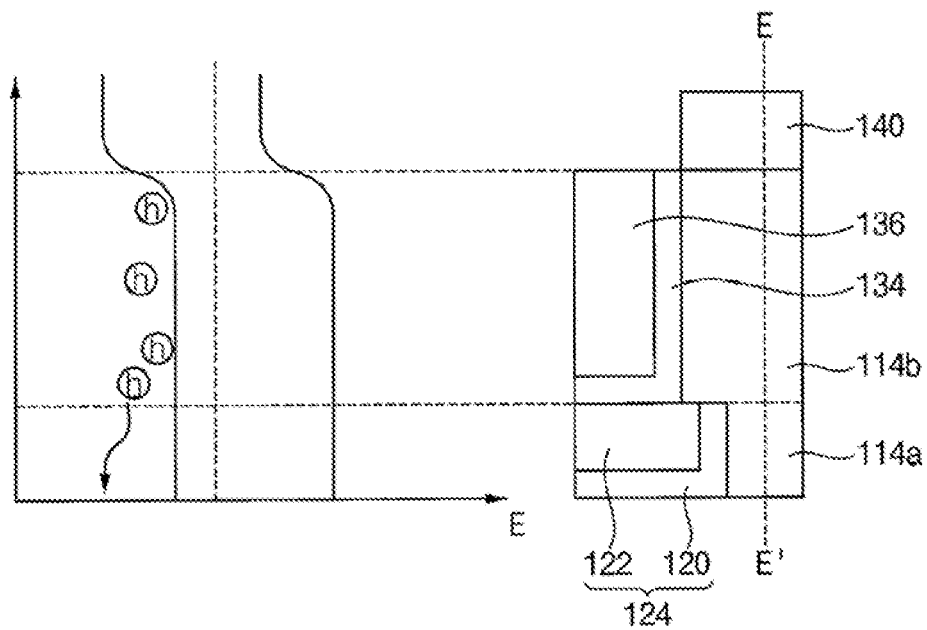
FIG. 3 is a cross-sectional view and an energy band of a vertical transistor in a semiconductor device in accordance with some embodiments.
Figure 4:
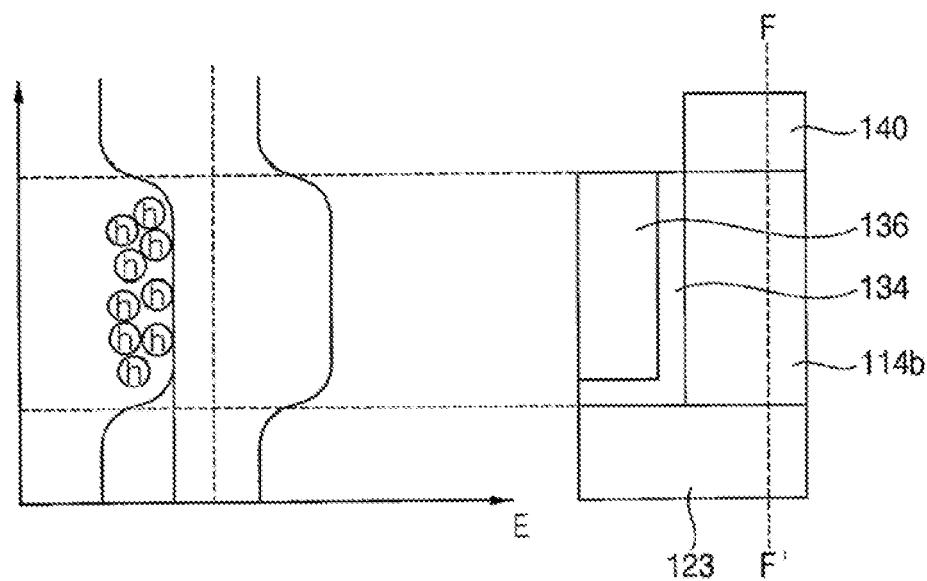
FIG. 4 is a cross-sectional view and an energy band of a vertical transistor that includes a first impurity region that includes diffused impurities for comparison with a present embodiment.

FIG. 3 is a cross-sectional view and an energy band of a vertical transistor in a semiconductor device shown in FIG. 1. FIG. 4 is a cross-sectional view and an energy band of a vertical transistor that includes a first impurity region that includes diffused impurities for comparison with a present embodiment.

FIG. 3 includes on the left side an energy band of a line E-E' in a cross-sectional view on the right side, and FIG. 4 includes on the left side an energy band of a line F-F' in the cross-sectional view on the right side.

Referring to FIG. 3, in some embodiments, the first impurity region 124 overlaps only a partial lower surface of the second semiconductor pattern 114b. That is, the portion of the lower surface of the second semiconductor pattern 114b contacts the first impurity region 124. The first semiconductor pattern 114a is connected to the lower surface of the second semiconductor pattern 114b and is disposed on a side of the first impurity region 124.

Thus, in some embodiments, the second semiconductor pattern 114b, which serves as a channel region of the vertical channel transistor, is not completely isolated by the first and second impurity regions 124 and 140. A portion of the lower surface of the second semiconductor pattern114b is connected to the first semiconductor pattern 114a.

In some embodiments, when the vertical channel transistor operates, an inversion layer, i.e, a channel, (regions I in FIG. 2) forms at the second semiconductor pattern 114b between the first and second impurity regions 124 and 140. A portion of the second semiconductor pattern 114b in which the inversion layer is not formed is connected to the first semiconductor pattern 114a.

In some embodiments, an energy barrier is not generated between the second semiconductor pattern 114b and the first semiconductor pattern 114a connected thereto, so that fewer holes accumulate in the channel region. Therefore, a target threshold voltage of the vertical channel transistor can be maintained, and leakage currents in the in the vertical channel transistor are reduced.

Referring to FIG. 4, for comparison with a present embodiment, a portion of the first semiconductor pattern 114a is doped with impurities to form a first impurity region 123. In this case, the impurities in the first impurity region 123 can diffuse into the first semiconductor pattern 114a adjacent to the first impurity region 123. Therefore, the first impurity region 123 overlaps an entire lower surface of the second semiconductor pattern 114b. That is, the lower surface of the second semiconductor pattern 114b contacts an entire upper surface of the first impurity region 123. Therefore, the second semiconductor pattern 114b, which serves as a channel region of a vertical channel transistor, is completely isolated by the first and second impurity regions 123 and 140. In this case, in the vertical channel transistor, an energy barrier is generated between the channel region 114b and the first impurity region 123 and between the channel region 114b and the second impurity regions 140. Therefore, holes do not escape from the channel region due to the energy gap, and the holes accumulate in the channel region. That is, a floating body effect occurs in the vertical transistor. The holes accumulate in the channel region, which lowers a threshold voltage of the vertical transistor, and generates leakage currents in the channel region.

As described above, a semiconductor device according to a present embodiment includes a vertical channel transistor that has excellent electrical characteristics. A contact resistance between the first impurity region of the vertical channel transistor and the first conductive pattern serving as the bit line is decreased. Thus, the semiconductor device has excellent electrical characteristics.

FIGS. 5 to 19 are perspective views and cross-sectional views that illustrate a method of manufacturing a semiconductor device shown in FIGS. 1 and 2.

FIGS. 5 to 7, 9, 11, 12, 14, 15, 16 and 18 are perspective views, and FIGS. 8, 10, 13, 17 and 19 are cross-sectional views.

Figure 7:
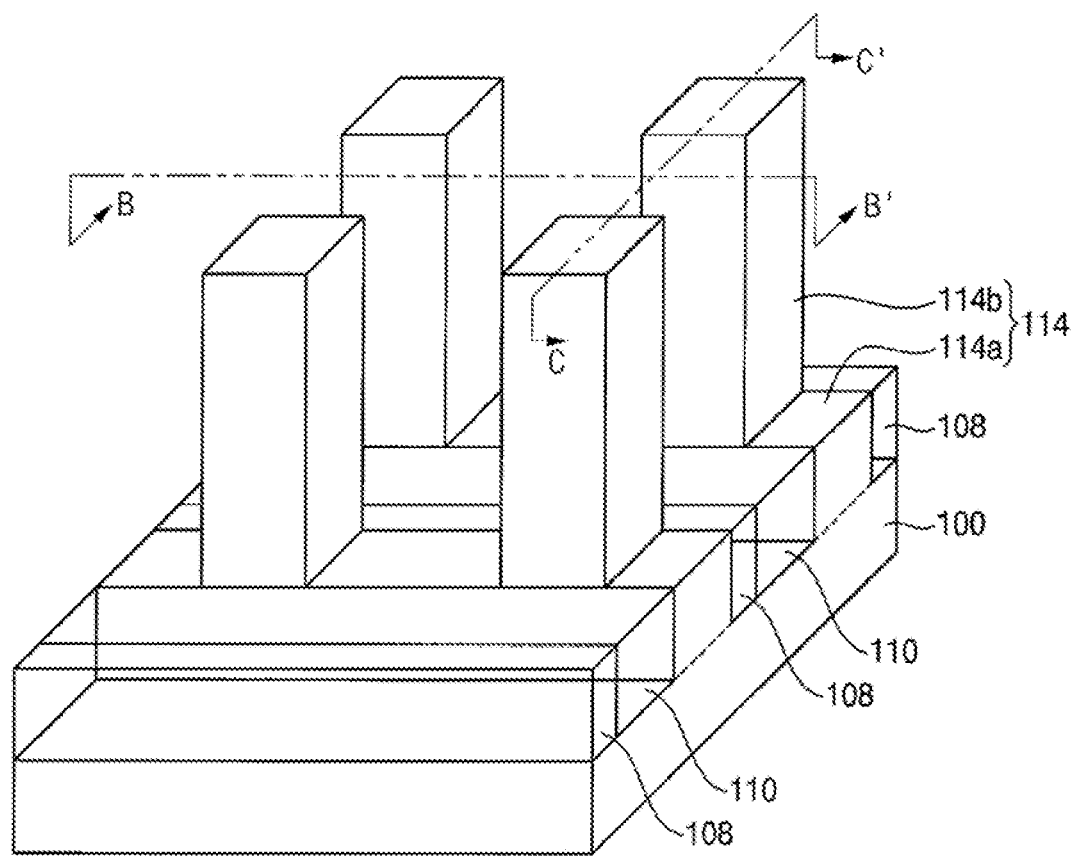
Figure 8:
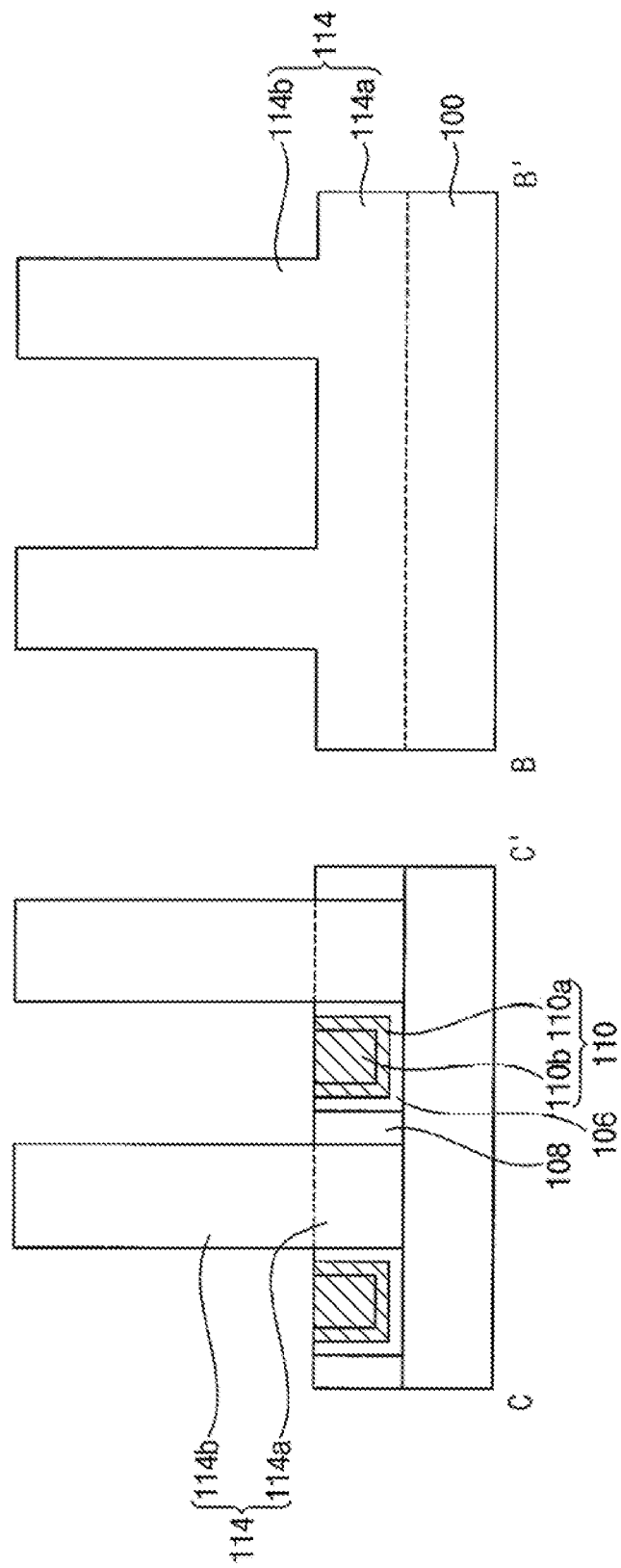

FIG. 8 includes cross-sectional views along lines C-C' and B-B' of FIG 7. FIGS. 10, 13, 17, and 19 include cross-sectional views along lines A-A' and B-B' in each of the perspective views.

Figure 5:
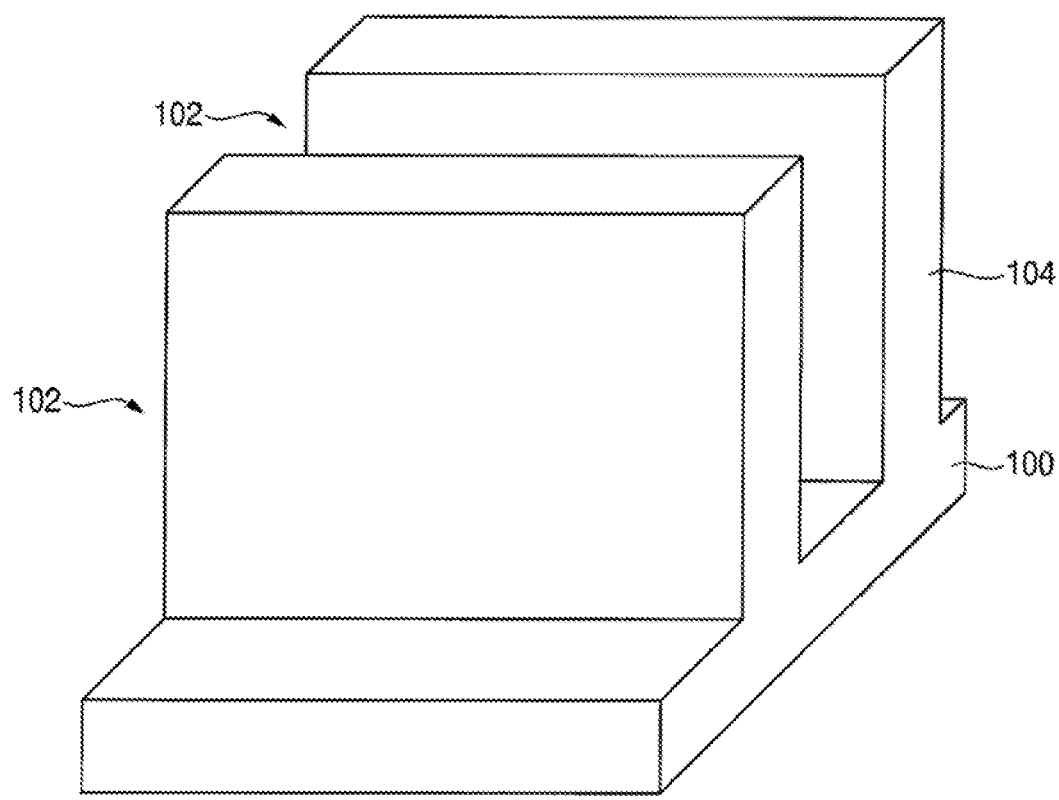
FIGS. 5 to 19 are perspective views and cross-sectional views that illustrate a method of manufacturing a semiconductor device according to some embodiments.

Referring to FIG. 5, in some embodiments, p-type impurities are lightly doped into an upper surface of a semiconductor substrate 100. A first etching mask that has a linear shape that extends in a first direction is formed on the semiconductor substrate 100, and then the semiconductor substrate is dry etched using the first etching mask to form first trenches 102. The semiconductor substrate 100 is a single crystal silicon substrate.

In some embodiments, each of the first trenches 102 has a first depth. The first trenches 102 extend in the first direction. A preliminary semiconductor pattern 104 that extends in the first direction is conned between adjacent first trenches 102. A plurality of preliminary semiconductor patterns 104 are repeatedly spaced apart in a second direction perpendicular to the first direction with first trenches formed between adjacent preliminary semiconductor patterns 104.

Figure 6:
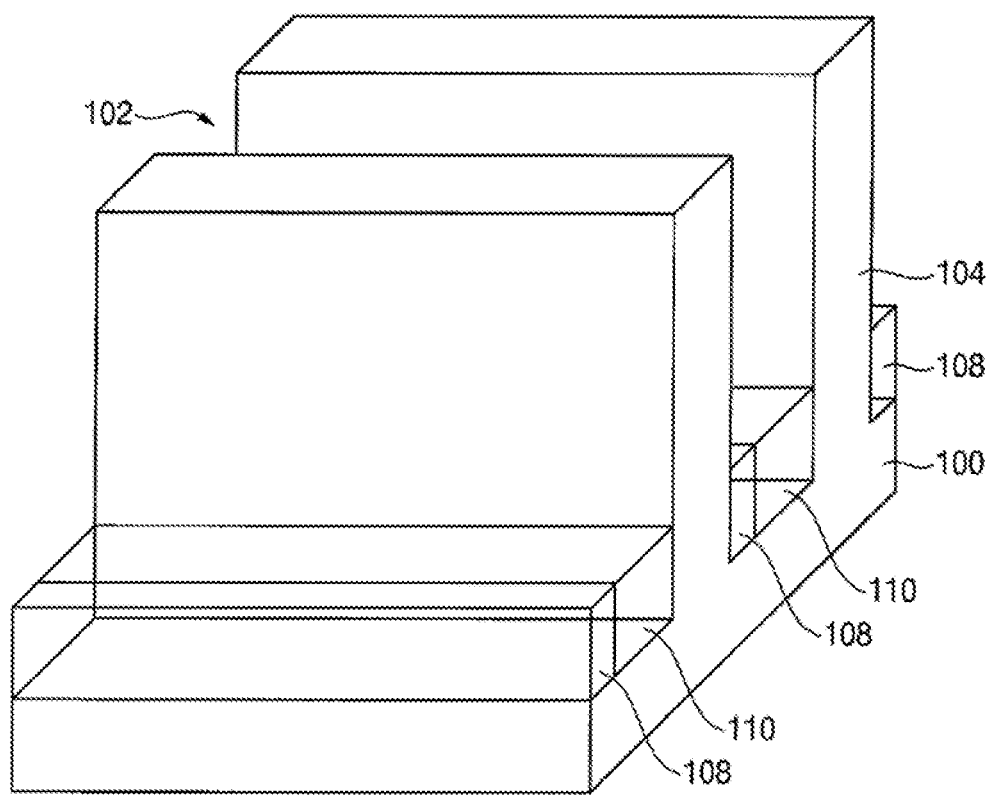
Figure 6:
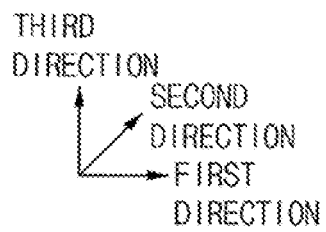

Referring to FIG. 6, in some embodiments, a first insulation layer is formed that fills the first trench 102, and a portion of the first insulation layer is etched to form a preliminary first insulation pattern. A first sidewall of the preliminary first insulation pattern extends in the first direction, and the first sidewall of the preliminary first insulation pattern contacts one sidewall of the preliminary semiconductor pattern 104. A gap that extends in the first direction is formed between a second sidewall that faces the first sidewall of preliminary first insulation pattern and the preliminary semiconductor pattern 104.

In some embodiments, a second insulation layer is conformally formed on the surface of the gap. The second insulation layer include, e.g., silicon oxide.

In some embodiments, a first conductive layer is formed on the second insulation layer. For example, a barrier metal layer is conformally formed on the second insulation layer, and a metal layer is formed on the barrier metal layer.

Thereafter, in some embodiments, upper portions of the first insulation layer, the second insulation layer, and the conductive layer are etched to form a first insulation pattern 108, a second insulation pattern 106 (see FIG. 8) and a first conductive pattern 110 that fill a lower portion of the first trench. The etching process includes an etch back process. The first conductive pattern 110 includes a barrier pattern 110a (see FIG. 8) and a metal pattern 110b (see FIG. 8). In the perspective views, the second insulation pattern, the barrier metal pattern, and the metal pattern are omitted to reduce the complexity of the drawing.

In some embodiments, the first conductive pattern 110 extends in the first direction, and the first conductive pattern 110 serves as a buried bit line. The second insulation pattern 106 covers sidewalls and the bottom of the first conductive pattern 110.

In some embodiments, the preliminary semiconductor pattern 104 protrudes from between the first conductive pattern 110 and the first insulation pattern 108.

Referring to FIGS. 7 and 8, in some embodiments, a second etching mask that has a line shape that extends in the second direction formed on the first conductive pattern 110 and the preliminary semiconductor pattern 104. The preliminary semiconductor pattern 104 is etched using the second etching mask to form a semiconductor structure 114. In the etching process that forms the semiconductor structure 114, an etching depth of the preliminary semiconductor pattern 104 is a second depth lower than the first depth.

As shown in FIGS. 7 and 8, in some embodiments, the semiconductor structure 114 includes a first semiconductor pattern 114a that extends in the first direction, and a plurality of second semiconductor patterns 114b that have a pillar shape and protrude upward from an upper surface of the first semiconductor pattern 114a. The second semiconductor patterns 114b are formed on the first semiconductor pattern 114a, and the second semiconductor patterns 114b are spaced apart from each other. The second semiconductor patterns 114b are arranged in each of the first and second directions in a lattice pattern.

In some embodiments, the first semiconductor pattern 114a is formed between the first trenches, which are filled with the first conductive pattern 110 and the first insulation pattern 108. In some embodiments, upper surfaces of the first conductive pattern 110 and the first insulation pattern 108 are substantially coplanar with an upper surface of the first semiconductor pattern 114a. Alternatively, the upper surfaces of the first conductive pattern 110 and the first insulation pattern 108 are lower than the upper surface of the first semiconductor pattern 114a.

Figure 9:
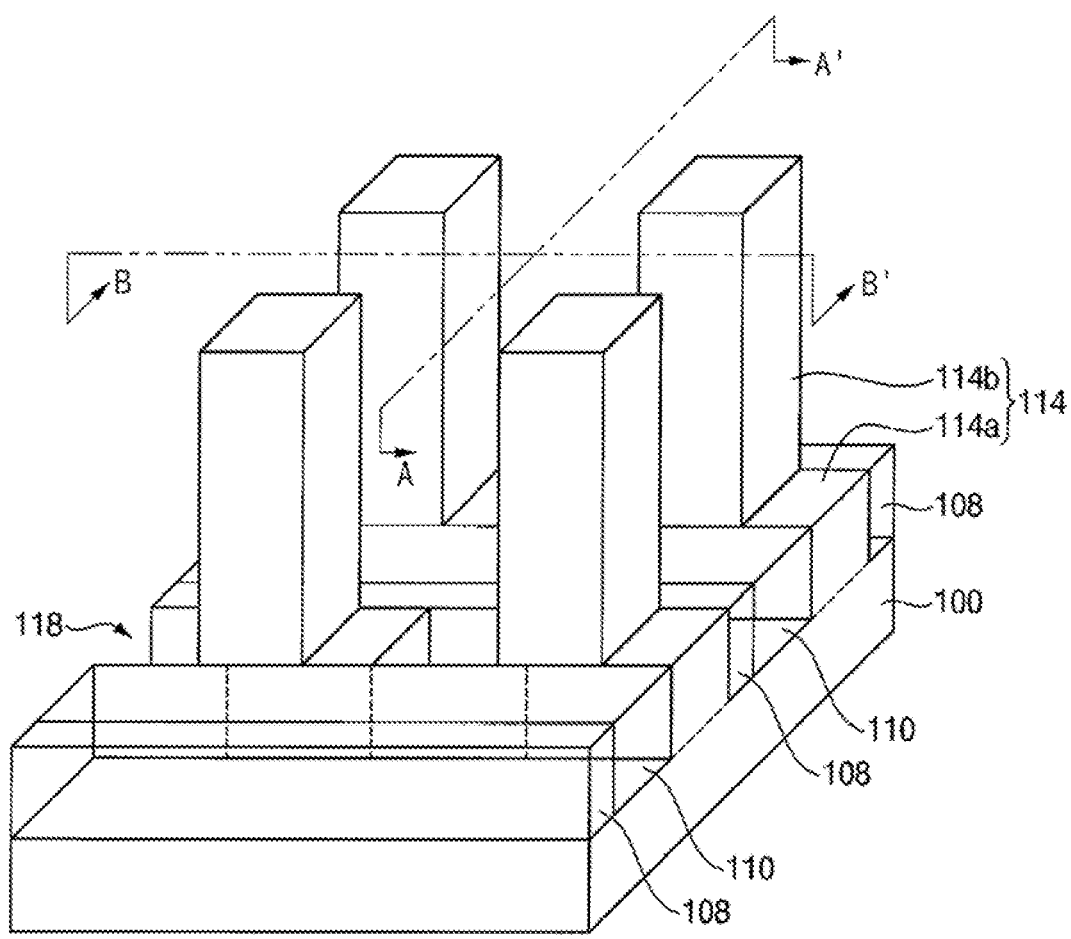
Figure 10:
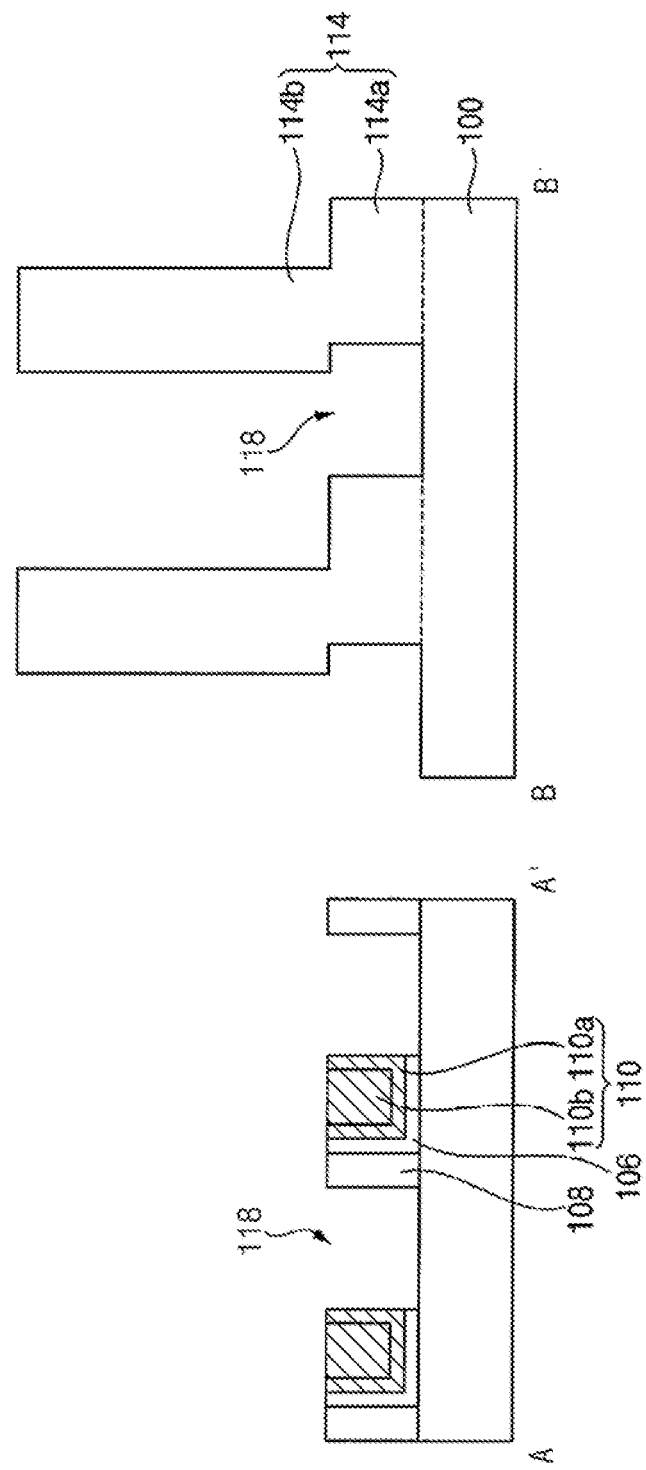

In FIGS. 9 and 10, in some embodiments, a third etching mask is formed that exposes a portion of the first semiconductor pattern 114a adjacent to a first sidewall in the first direction of the second semiconductor pattern 114b. The third etch mask is for forming a polysilicon pattern that serves as a first impurity region, i.e., a lower impurity region, of a cell transistor.

In some embodiments, a portion of the first semiconductor pattern 114a is etched using the third etching mask to form a first opening 118. The first opening 118 is isolated. The first conductive pattern 110 is exposed in the second direction by a first sidewall of the first opening 118. The first insulation pattern 108 is exposed by a second sidewall that faces the first sidewall of the first opening 118.

That is, in some embodiments, the second insulation pattern 106 on the sidewall of the first conductive pattern 110 is removed, so that the barrier metal pattern 110a of the first conductive pattern 110 is exposed by the first sidewall of the first opening 118. The first opening 118 is formed to have an undercut shape that extends to the first semiconductor pattern 114a under a portion of a lower surface of the second semiconductor pattern 114b.

Figure 11:
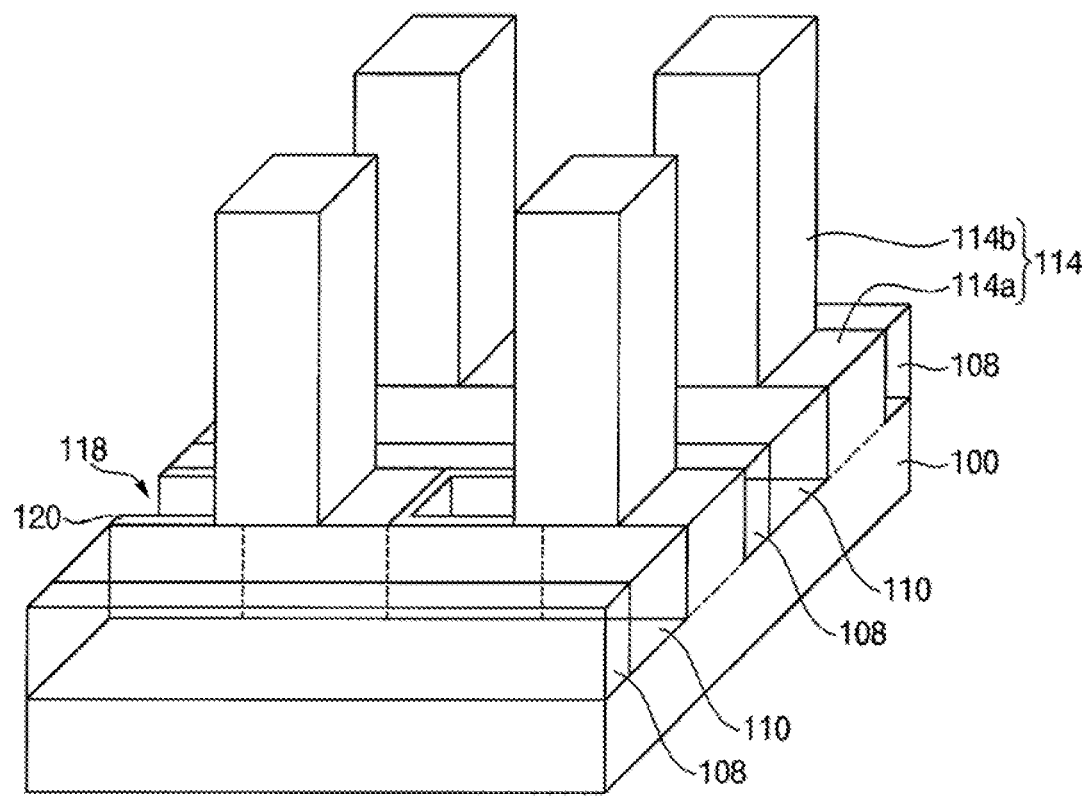
Figure 11:
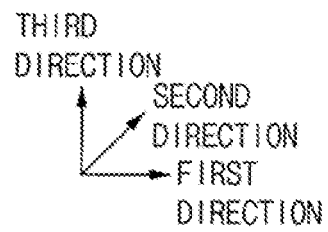
Figure 12:
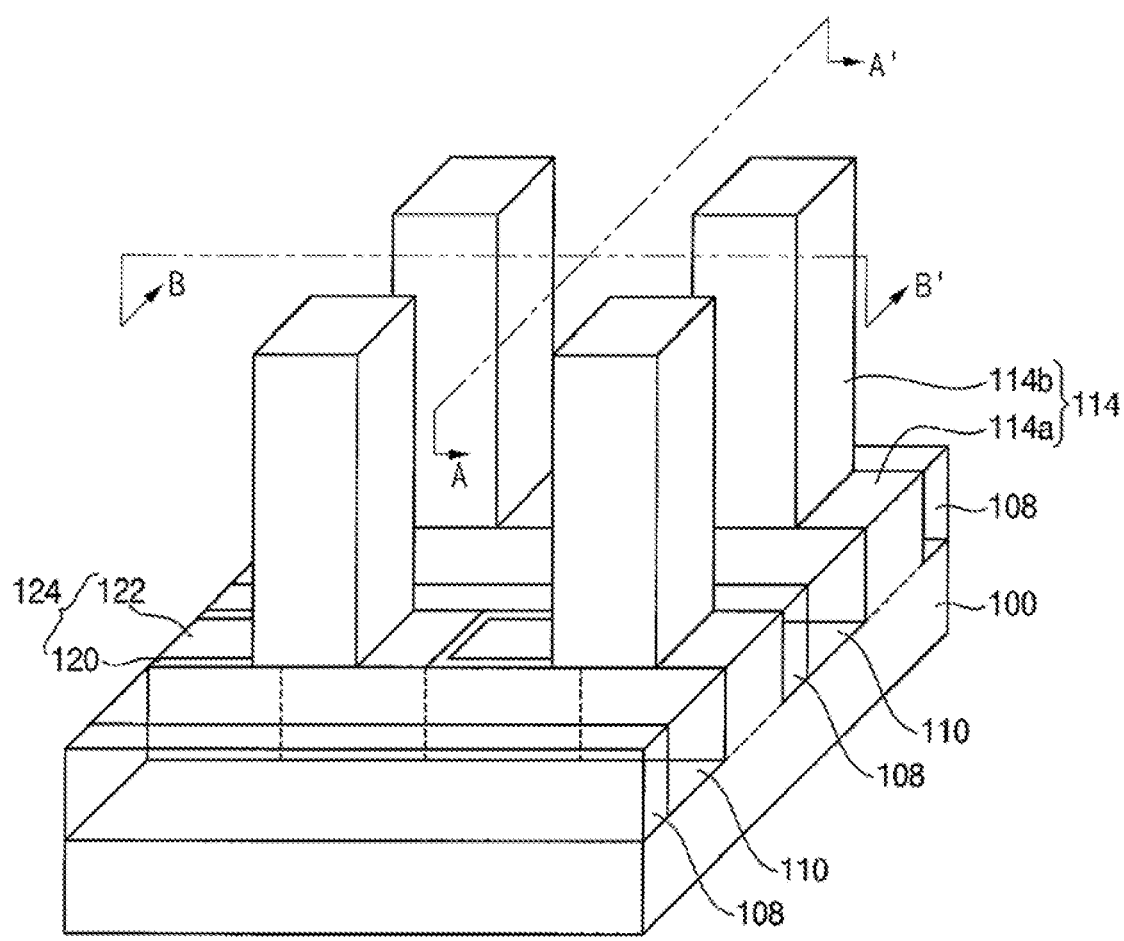
Figure 13:
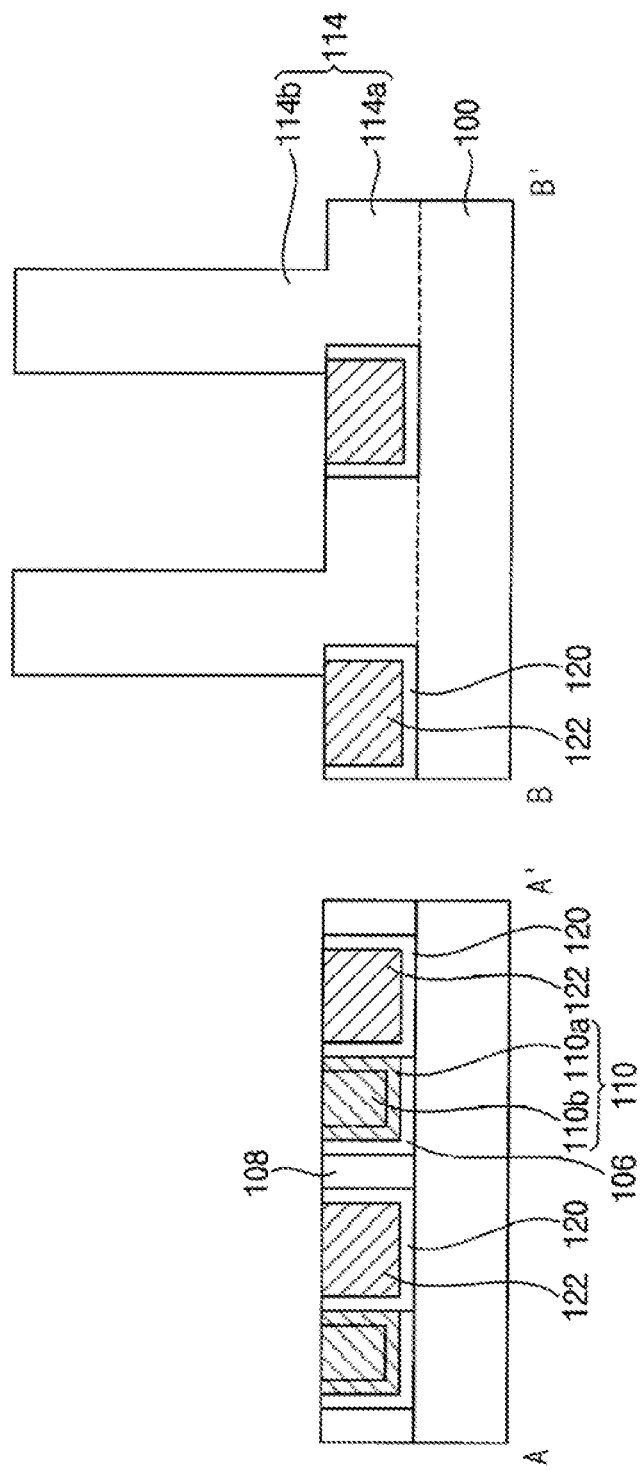

Referring to FIGS. 11 to 13, in some embodiments, an impurity diffusion barrier layer is conformally formed on sidewalls and the bottom of the first opening 118. In some embodiments, the impurity diffusion barrier layer includes a graphene layer. The graphene layer is formed by a chemical vapor deposition process. The graphene layer is conductive. The graphene layer can prevent diffusion of impurities.

In some embodiments, a first semiconductor layer doped with impurities is formed on the impurity diffusion barrier layer. In some embodiments, a first polysilicon layer doped with impurities is formed on the impurity diffusion barrier layer. For example, the first polysilicon layer is doped with n-type impurities. In some embodiments, the first polysilicon layer is deposited by an in-situ doping process.

In some embodiments, upper portions of the impurity diffusion barrier layer and the first polysilicon layer are etched to form an impurity diffusion barrier pattern 120 and a first polysilicon pattern 122 that fills the first opening 118.

In some embodiments, the impurity diffusion barrier pattern 120 surrounds sidewalls and the bottom of the first polysilicon pattern 122. The impurity diffusion barrier pattern 120 prevents impurities that are doped into the first polysilicon pattern 122 from diffusing into the first and second semiconductor patterns 114a and 114b adjacent to the first polysilicon pattern 122. The impurity diffusion barrier pattern 120 and the first polysilicon pattern 122 form a first impurity region 124 that serves as a source/drain of a vertical channel transistor.

In some embodiments, when a sidewall of the first impurity region 124 and a first sidewall of the first conductive pattern 110 contact each other, the first impurity region 124 and the first conductive pattern 110 are electrically connected to each other, in particular, the impurity diffusion barrier pattern 120 of the first impurity region 124 contacts the barrier metal pattern 110a of the first conductive pattern 110 in a second direction. In this case, the impurity diffusion barrier pattern 120 is formed of graphene, which has a low resistance, and which decreases a contact resistance between the impurity diffusion barrier pattern 120 and the barrier metal pattern 110a. That is, a resistance of a bit line contact is decreased.

Figure 14:
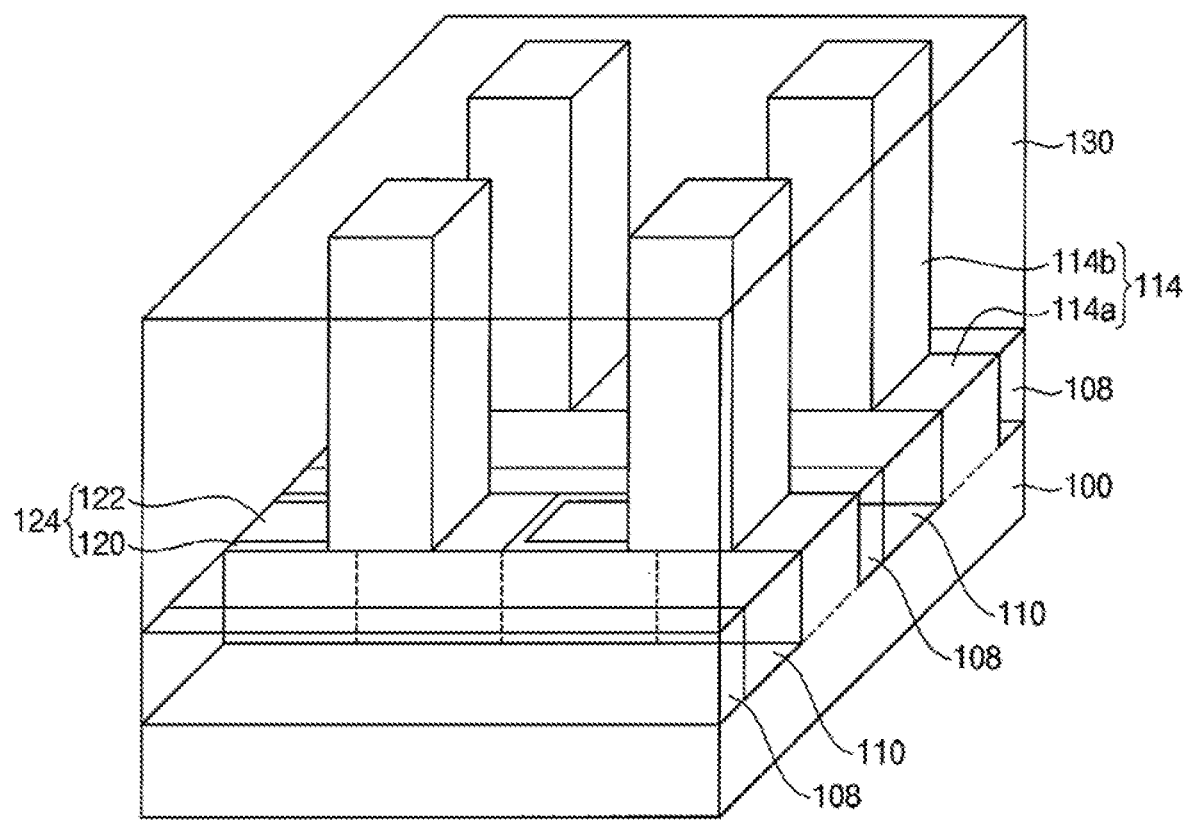
Figure 14:
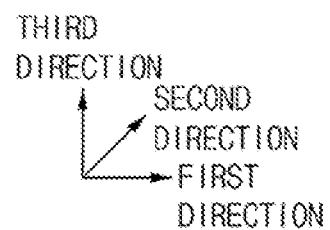

Referring to FIG. 14, in some embodiments, a first insulating interlayer 130 is formed that covers the first conductive pattern 110, the semiconductor structure 114, the first insulation pattern 108, and the first impurity region 124.

Figure 15:
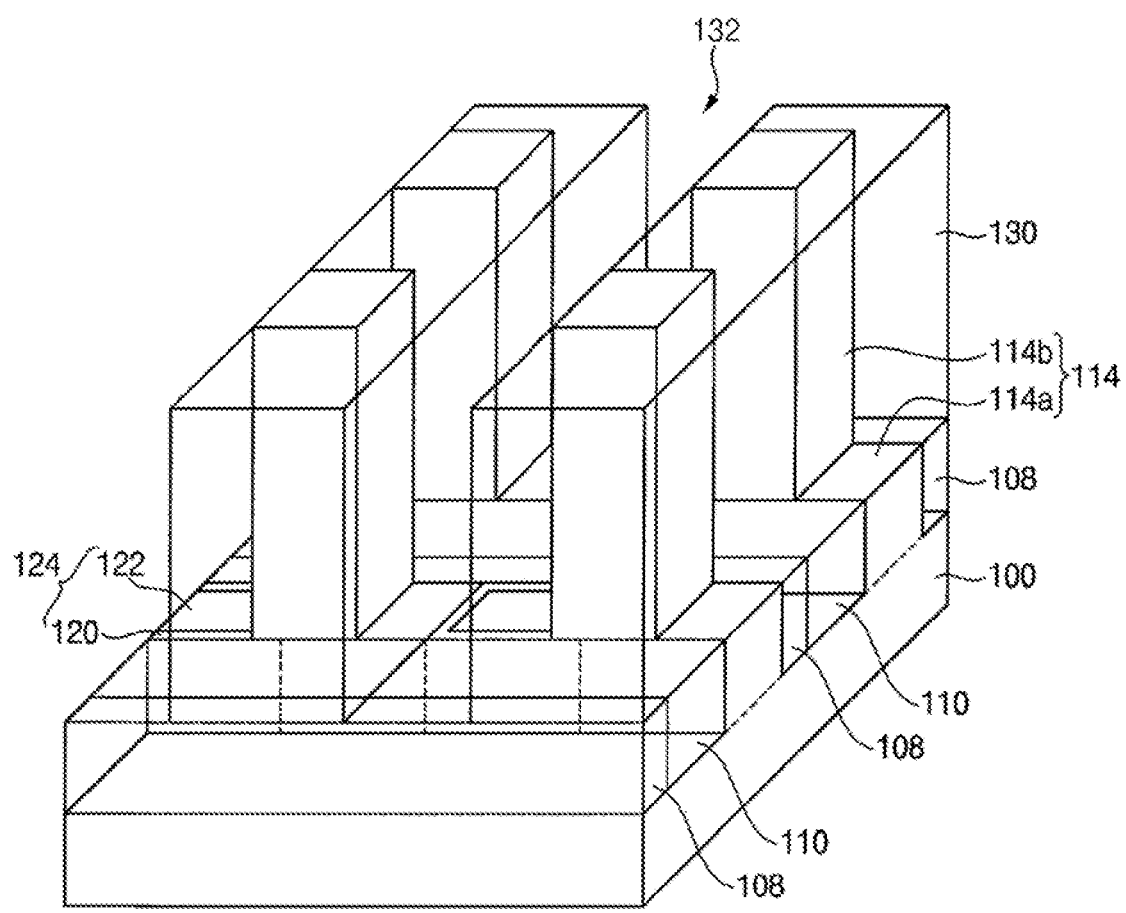

Referring to FIG. 15, in some embodiments. a fourth etching mask that has a linear shape that extends in the second direction is formed on the first insulating interlayer 130. Thereafter, the first insulating interlayer 130 is etched using the fourth etching mask to form a second trench 132 that extends in the second direction.

In some embodiments, the first sidewall of the second semiconductor pattern 114b is exposed by a first sidewall of the second trench 132. The second semiconductor pattern 114b is not exposed by a second sidewall that faces the first sidewall of the second trench 132, and the first insulating interlayer 130 is exposed by the second sidewall of the second trench 132. A bottom of the second trench 132 exposes an upper portion of the first impurity region 124.

Figure 16:
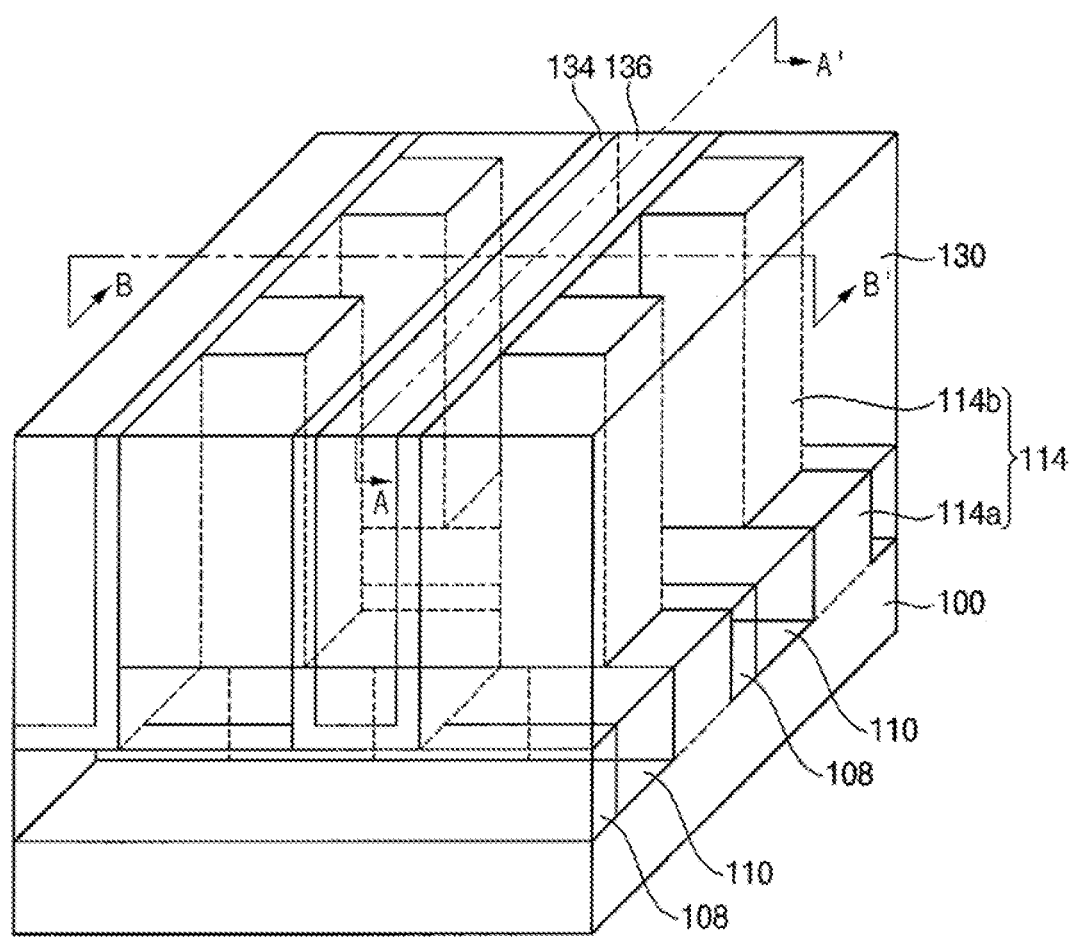
Figure 17:
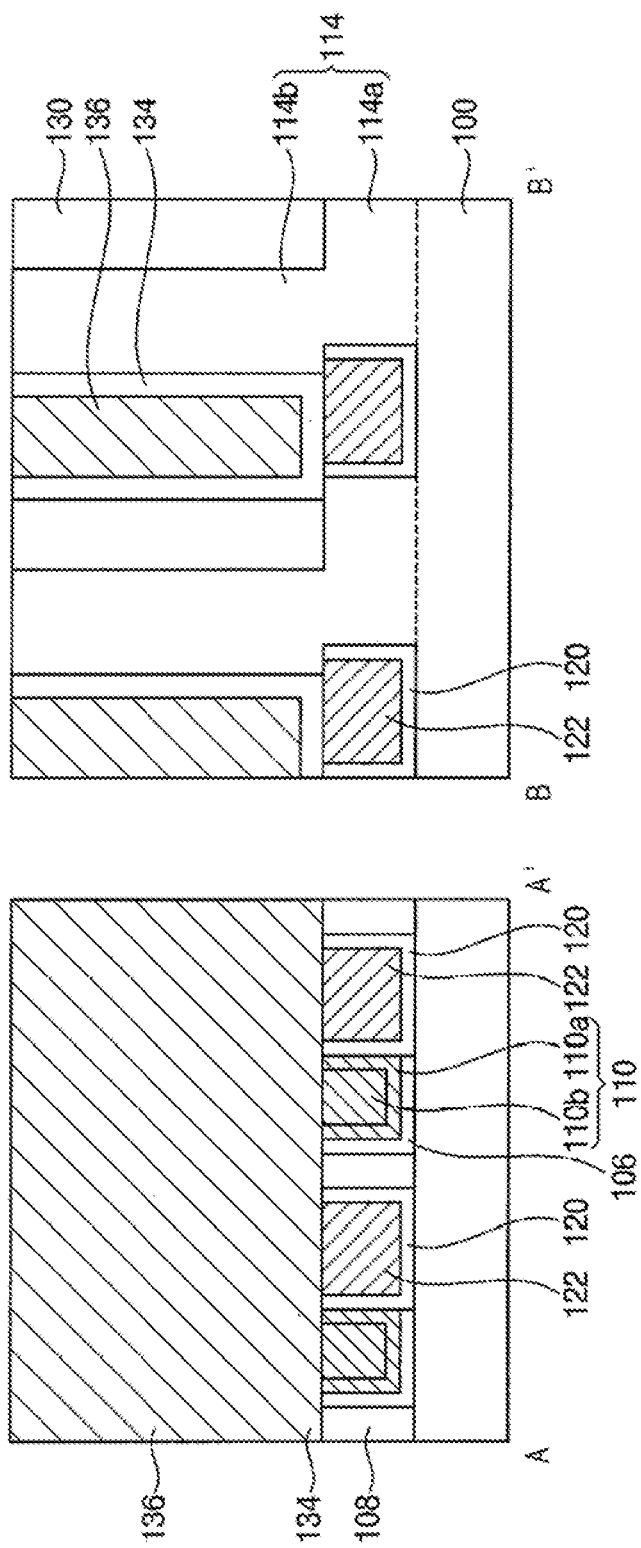

Referring to FIGS. 16 and 17, in some embodiments, a gate insulation layer is conformally formed on a surface of the second trench 132 and an upper surface of the first insulating interlayer 130. Thus, the gate insulation layer contacts the first sidewall of the second semiconductor pattern 114b, and the gate insulation layer covers the upper portion of the first impurity region 124. A second conductive layer is formed on the gate insulation layer that completely fills the second trench 132.

Thereafter, in some embodiments, the gate insulation layer, the second conductive layer, and the first insulating interlayer 130 are planarized until an upper surface of the second semiconductor pattern 114b is exposed to form a gate insulation pattern and second conductive pattern 136 in the second trench 132.

In some embodiments, the second conductive pattern 136 serves as a gate electrode. The second conductive pattern 136 extends in the second direction, and the second conductive pattern 136 serves as a word line.

Figure 18:
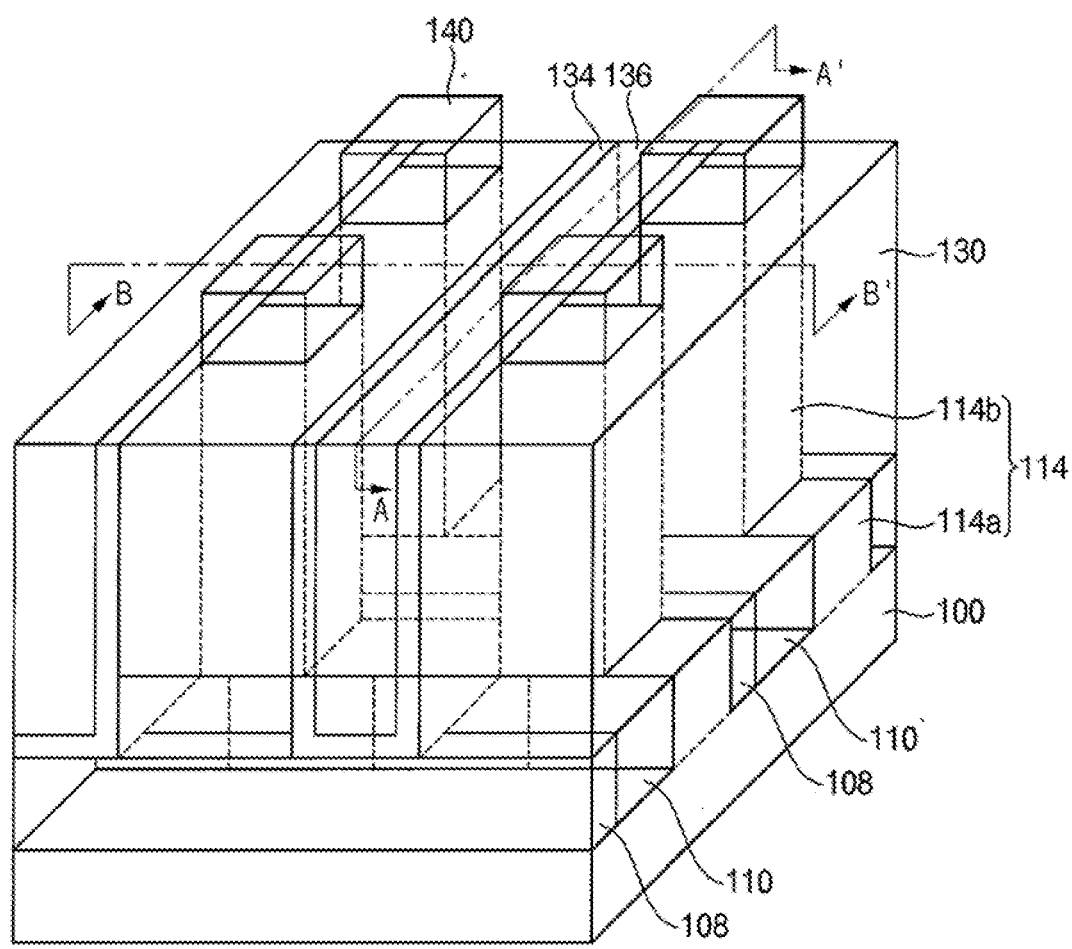
Figure 19:
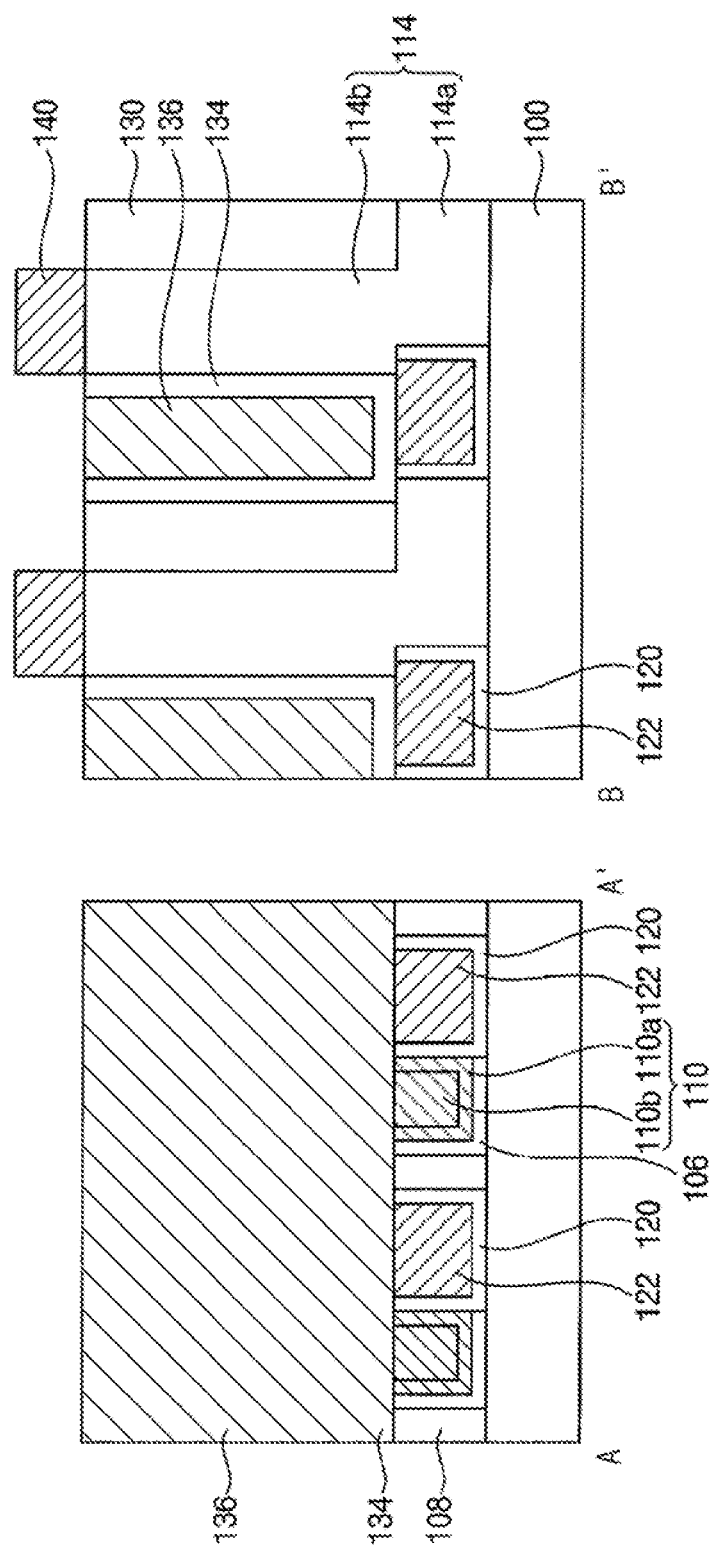

Referring to FIGS. 18 and 19, in some embodiments, a second semiconductor layer doped with impurities is formed on the second semiconductor pattern 114b, the gate insulation pattern 134, the second conductive pattern 136, and the first insulating interlayer 130. In some embodiments, the second semiconductor layer includes a polysilicon layer doped with impurities. The second semiconductor layer is referred to as a second polysilicon layer. Impurities doped in the second polysilicon layer have a same conductivity type as that of the impurities doped in the first polysilicon pattern 122. For example, the second polysilicon layer is doped with n-type impurities.

In some embodiments, the second polysilicon layer is patterned to form a second polysilicon pattern 140 on the second semiconductor pattern 114b. Each of the second polysilicon patterns 140 is isolated.

In some embodiments, the second polysilicon pattern 140 serves as a second impurity region of the vertical channel transistor.

Referring to FIG. 2 again, in some embodiments, a capacitor 166 is formed on the second polysilicon pattern 140. The capacitor 166 includes a lower electrode 160, a dielectric layer 162 and an upper electrode 164. The lower electrode 160 has a pillar shape or a hollow cylindrical shape.

As described above, in some embodiments, a semiconductor device that includes a vertical channel transistor can be manufactured. The first impurity region 124 of the vertical channel transistor includes the first polysilicon pattern 122 and the impurity diffusion barrier pattern 120 that surrounds the surface of the first polysilicon pattern 122. The impurity diffusion barrier pattern 120 prevents impurities that are doped in the first polysilicon pattern 122 from diffusing into the first and second semiconductor patterns 114a and 114b adjacent to the first polysilicon pattern 122. If the first impurity region overlaps an entire lower surface of the second semiconductor pattern, the vertical channel transistor can generate a floating body effect. That is, diffusion of the impurities doped in the first polysilicon pattern can generate the floating body effect in the vertical channel transistor. However, in a vertical channel transistor in accordance with some embodiments, the floating body effect is reduced by the impurity diffusion barrier pattern 120. In a vertical channel transistor in accordance with some embodiments, a target threshold voltage can be maintained, and leakage currents can be reduced.

Figure 20:
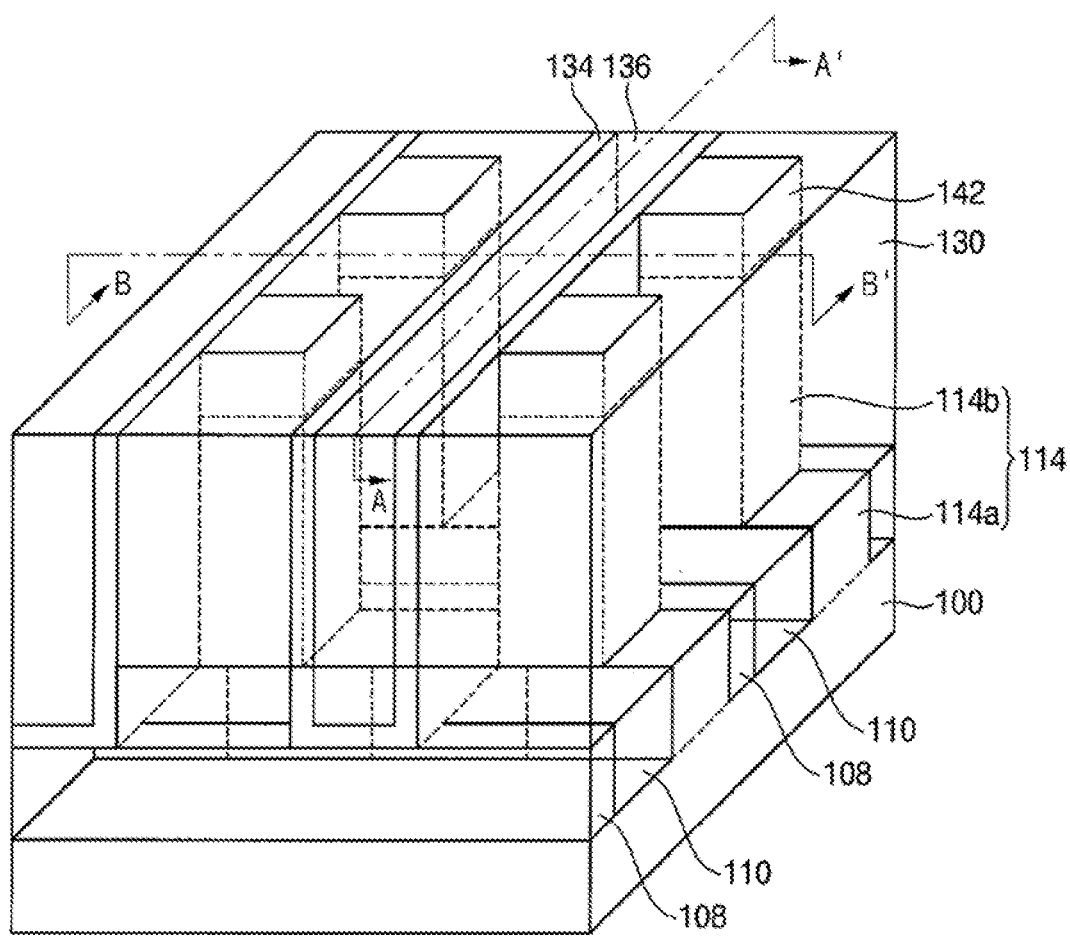
FIG. 20 is a perspective view of a semiconductor device in accordance with some embodiments.
Figure 20:
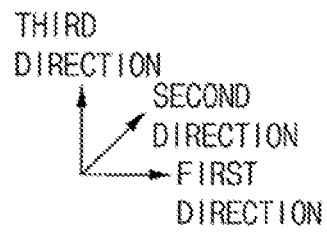
Figure 21:
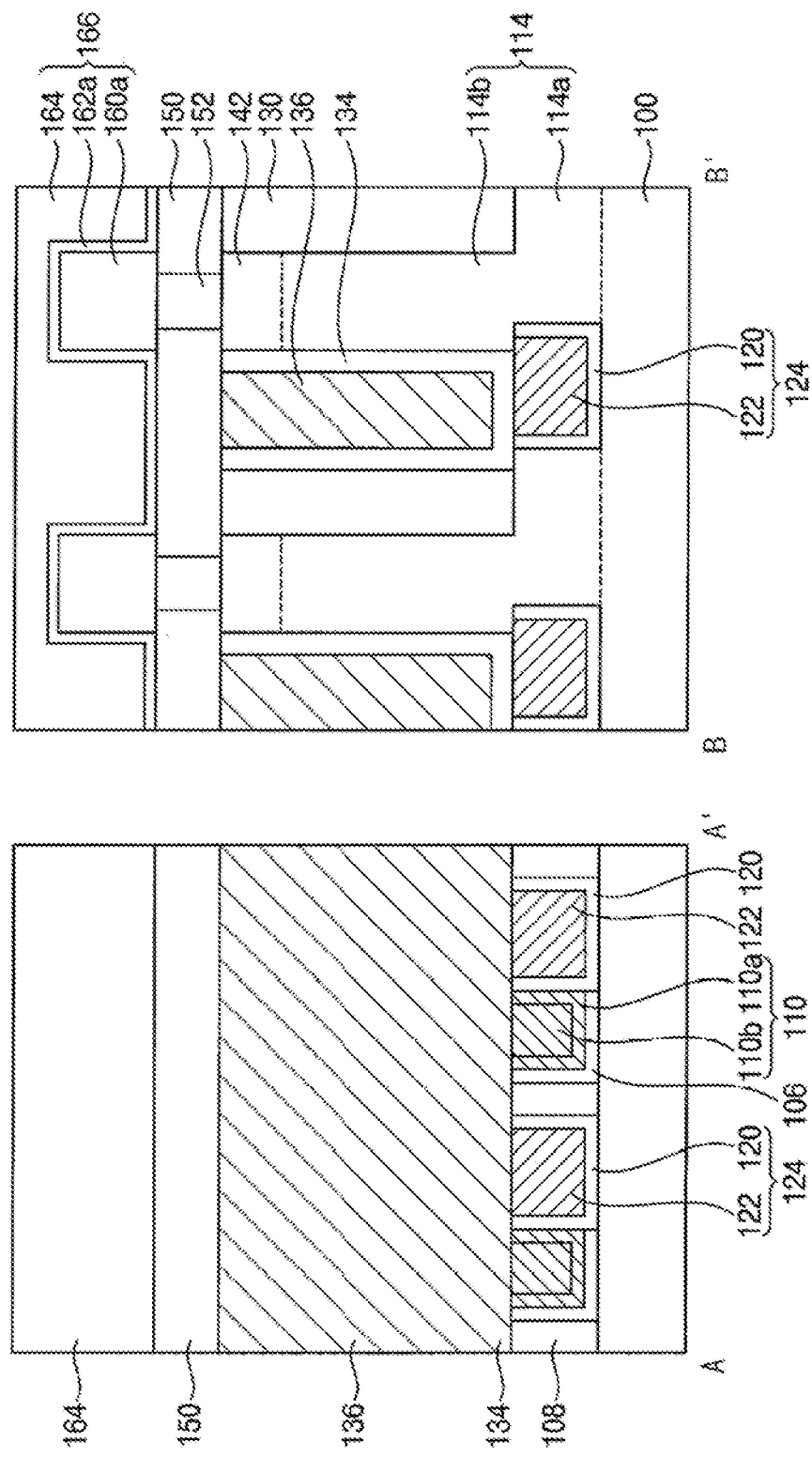
FIG. 21 is cross-sectional views of a semiconductor device according to some embodiments.

FIG. 20 is a perspective view of a semiconductor device in accordance with some embodiments. FIG. 21 is cross-sectional views of a semiconductor device shown in FIG. 20.

FIG. 21 includes cross-sectional views along lines A-A' and B-B' of FIG. 20.

A semiconductor device illustrated in FIGS. 20 and 21 is substantially the same as a semiconductor device illustrated in FIGS. 1 and 2, except for the second impurity region. Therefore, repeated descriptions are omitted.

Referring to FIGS. 20 and 21 in some embodiments, an upper portion of the second semiconductor pattern 114b is doped with impurities. The upper portion of the second semiconductor pattern 114b is a second impurity region 142.

In some embodiments, the second impurity region 142 faces the second conductive pattern 136 in the first direction, with the gate insulation pattern interposed therebetween. An upper surface of the second impurity region 142 is substantially coplanar with an upper surface of the second conductive pattern 136.

In some embodiments, an upper surface of the second conductive pattern 136 is lower than an upper surface of the second impurity region 142.

In some embodiments, a second insulating interlayer 150 is formed on the first insulating interlayer 130, the gate insulation pattern 134, the second conductive pattern 136, and the second semiconductor pattern 114b. A contact plug 152 penetrates the second insulating interlayer 150, and the contact plug 152 contacts the second impurity region 142.

In some embodiments, a capacitor 166 is formed on the contact plug 152.

Figure 22:
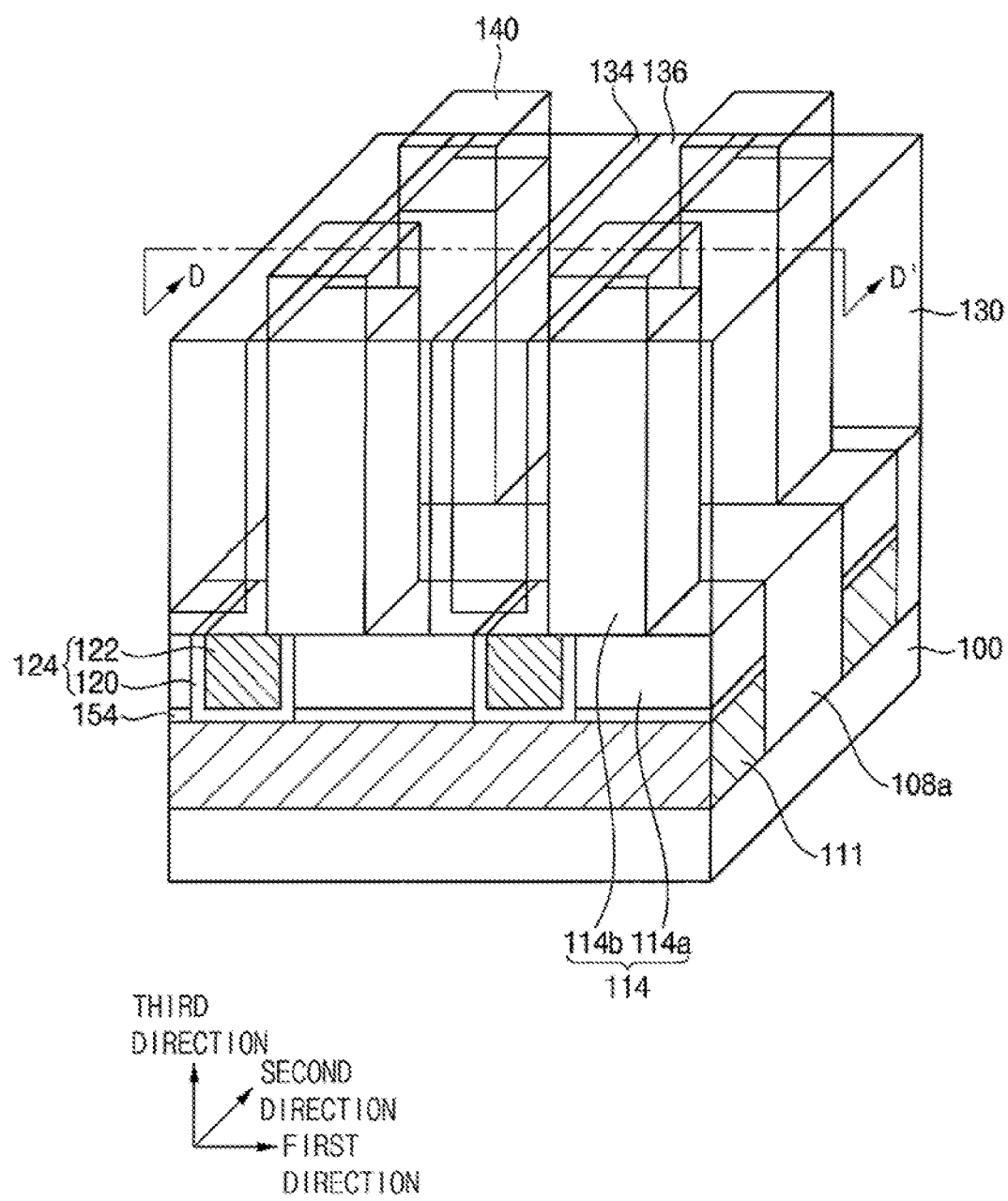
FIG. 22 is a perspective view of a semiconductor device in accordance with some embodiments.
Figure 23:
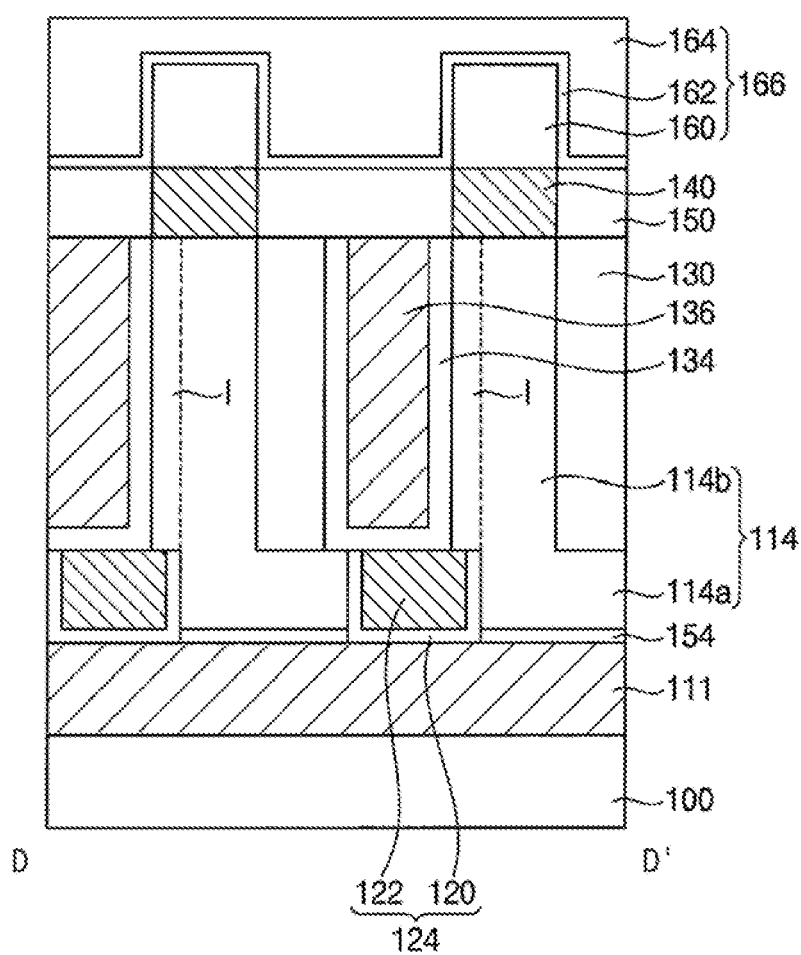
FIG. 23 is a cross-sectional view of a semiconductor device in accordance with some embodiments.

FIG. 22 is a perspective view of a semiconductor device in accordance with some embodiments. FIG. 23 is a cross-sectional view of a semiconductor device in accordance with some embodiments.

FIG. 23 is a cross-sectional views along line D-D' of FIG. 22.

In some embodiments, a semiconductor device shown in FIGS. 22 and 23 21 is substantially the same as a semiconductor device illustrated in FIGS. 1 and 2, except for a position of the first conductive pattern that serves as a buried bit line, and a contact portion of the first conductive pattern and the first impurity region. Therefore, repeated descriptions are omitted.

Referring to FIGS. 22 and 23, in some embodiments, the first conductive pattern 111 is formed under the semiconductor structure 114. An insulation pattern 154 is interposed between the semiconductor structure 114 and an upper surface of the first conductive pattern 111.

In some embodiments, the first impurity region 124 is disposed on the first conductive pattern 111. An upper surface of the first conductive pattern 111 and a lower surface of the first impurity region 124 contact each other. In particular, the impurity diffusion barrier pattern 120 positioned at a bottom of the first opening 118 contacts an upper surface of the first conductive pattern 111. Thus, a contact resistance between the first impurity region 124 and the first conductive pattern 111 is reduced.

In some embodiments, a first insulation pattern 108a fills a space between stacked structures that include the first conductive pattern 111 and the semiconductor structure 114.

A vertical transistor in the semiconductor device in accordance with some embodiments can be used as a selection transistor for various memory devices. In addition, a semiconductor device in accordance with some embodiments can be used as a memory device electronic products such as mobile devices, memory cards, or computers, etc.

The foregoing is illustrative of embodiments and is not to be construed as limiting thereof. Although a few embodiments have been described, those skilled in the art will readily appreciate that many modifications are possible in embodiments without materially departing from the novel teachings of the present inventive concept. Accordingly, all such modifications are intended to be included within the scope of embodiments of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:
1. A semiconductor device, comprising:
a plurality of semiconductor structures disposed on a substrate,
wherein each of the semiconductor structures includes a first semiconductor pattern that has a linear shape that extends in a first direction and second semiconductor patterns that protrude in a vertical direction from an upper surface of the first semiconductor pattern, wherein the semiconductor structures are spaced apart from each other in a second direction perpendicular to the first direction;
a first conductive pattern formed in a first trench between the first semiconductor patterns, wherein the first conductive pattern extends in the first direction;
a first impurity region formed in the opening in the first semiconductor pattern adjacent to a first sidewall of the second semiconductor pattern, wherein the first impurity region includes an impurity diffusion barrier pattern and a polysilicon pattern doped with impurities;
a gate insulation pattern disposed on the first sidewall of each of the second semiconductor pattern;
a second conductive pattern that extends in the second direction on the gate insulation pattern; and
a second impurity region disposed on each of the second semiconductor patterns, wherein the impurity diffusion barrier pattern surrounds sidewalls and a bottom of the polysilicon pattern.

2. The semiconductor device of claim 1, wherein the impurity diffusion barrier pattern includes graphene.

3. The semiconductor device of claim 1, wherein a sidewall of the first impurity region and a sidewall or the first conductive pattern contact each other.

4. The semiconductor device of claim 3, wherein the impurity diffusion barrier pattern of the first impurity region and the sidewall of the first conductive pattern contact each other.

5. The semiconductor device of claim 1, wherein the first impurity region extends from a position spaced apart from a lower portion of the first sidewall of the second semiconductor pattern to a position that overlaps a partial lower surface of the second semiconductor pattern.

6. The semiconductor device of claim 1, wherein the first semiconductor pattern is connected to a lower surface of the second semiconductor pattern and is disposed on a side of the first impurity region.

7. The semiconductor device of claim 1, wherein the second impurity region is formed on an uppermost surface of the second semiconductor pattern, and the second impurity region includes a second polysilicon pattern doped with impurities.

8. The semiconductor device of claim 1, wherein the second impurity region is an upper portion of the second semiconductor pattern that is doped with impurities.

9. The semiconductor device of claim 1, further comprising a first insulation pattern that extends in the first direction, wherein the first insulation pattern contacts a sidewall of the first conductive pattern in the first trench.

10. The semiconductor device of claim 1, further comprising a capacitor that is electrically connected to the second impurity region.

11. A semiconductor device, comprising:
a plurality of semiconductor structures disposed on a substrate, wherein each of the semiconductor structures includes a first semiconductor pattern that has a linear shape that extends in a first direction and second semiconductor patterns that protrude in a vertical direction from an upper surface of the semiconductor pattern, wherein the semiconductor structures are spaced apart from each other in a second direction perpendicular to the first direction;
a first conductive pattern formed in a first trench between the first semiconductor patterns, wherein the first conductive pattern extends in the first direction;
a first insulation pattern formed in the first trench between the first semiconductor patterns, wherein the first insulation pattern contacts a sidewall of the first conductive pattern, and the first insulation pattern extends in the first direction;
a first impurity region formed in the opening and that extends from a position spaced apart from a lower portion of a first sidewall of the second semiconductor pattern to a position that overlaps a partial lower surface of the second semiconductor pattern, wherein the first impurity region includes an impurity diffusion barrier pattern and a polysilicon pattern doped with impurities;
a gate insulation pattern disposed on the first sidewall of each of the second semiconductor patterns;
a second conductive pattern that extends in the second direction on the gate insulation pattern; and
a second impurity region formed on each of the second semiconductor patterns,
wherein a sidewall of the first impurity region and a sidewall of the first conductive pattern contact each other, and
wherein the impurity diffusion barrier pattern surrounds sidewalls and a bottom of the polysilicon pattern.

12. The semiconductor device of claim 11, wherein-the first impurity region is formed in an opening in the first semiconductor pattern is adjacent to a first sidewall of the second semiconductor pattern.

13. The semiconductor device of claim 11, wherein the impurity diffusion barrier pattern includes graphene.

14. The semiconductor device of claim 11, wherein the impurity diffusion barrier pattern of the first impurity region and the sidewall of the first conductive pattern contact each other.

15. The semiconductor device of claim 11, wherein the first semiconductor pattern is connected to a lower surface of the second semiconductor pattern and is disposed on a side of the first impurity region.

16. A semiconductor device, comprising:
a semiconductor structure disposed on a substrate, wherein the semiconductor structure includes a first semiconductor pattern that has a linear shape that extends in a first direction and second semiconductor patterns that protrude in a vertical direction from an upper surface of the first semiconductor pattern;
a first impurity region that extends from a position spaced apart from a lower portion of a first sidewall of the second semiconductor pattern to a position that overlaps a partial lower surface of the second semiconductor pattern, wherein the first impurity region includes an impurity diffusion barrier pattern and a polysilicon pattern doped with impurities;
a gate insulation pattern disposed on the first sidewall of the second semiconductor pattern;
a second conductive pattern formed on the gate insulation pattern; and
a second impurity region formed on the second semiconductor patterns,
wherein the impurity diffusion barrier pattern surrounds sidewalls and a bottom of the polysilicon pattern.

17. The semiconductor device of claim 16, wherein the impurity diffusion barrier pattern includes grapheme.

18. The semiconductor device of claim 16, wherein the first impurity region is formed in an opening in the first semiconductor pattern adjacent to the first sidewall of the second semiconductor pattern.

* * * * *